(12) United States Patent
Shah et al.

(10) Patent No.: US 11,503,720 B2
(45) Date of Patent: Nov. 15, 2022

(54) FLEXIBLE DEVICE INCLUDING CONDUCTIVE TRACES WITH ENHANCED STRETCHABILITY

(71) Applicant: 3M INNOVATIVE PROPERTIES COMPANY, St. Paul, MN (US)

(72) Inventors: Saagar Shah, Minneapolis, MN (US); Mikhail L. Pekurovsky, Bloomington, MN (US); Ankit Mahajan, Cupertino, CA (US); Lyudmila A. Pekurovsky, Bloomington, MN (US); Jessica Chiu, Woodbury, MN (US); Jeremy K. Larsen, Farmington, MN (US); Kara A. Meyers, Oakdale, MN (US); Teresa M. Goeddel, St. Paul, MN (US); Thomas J. Metzler, St. Paul, MN (US); Jonathan W. Kemling, Woodbury, MN (US); Richard J. Pokorny, Maplewood, MN (US); Benjamin R. Coonce, St. Paul, MN (US); Chad M. Amb, Roberts, WI (US); Thomas P. Klun, Lakeland, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 17/270,912

(22) PCT Filed: Sep. 12, 2019

(86) PCT No.: PCT/IB2019/057719
§ 371 (c)(1),
(2) Date: Feb. 24, 2021

(87) PCT Pub. No.: WO2020/058815
PCT Pub. Date: Mar. 26, 2020

(65) Prior Publication Data
US 2021/0212216 A1  Jul. 8, 2021

Related U.S. Application Data

(60) Provisional application No. 62/783,551, filed on Dec. 21, 2018, provisional application No. 62/732,280, filed on Sep. 17, 2018.

(51) Int. Cl.
*H05K 3/32* (2006.01)
*H01L 23/14* (2006.01)
(Continued)

(52) U.S. Cl.
CPC ............ *H05K 3/326* (2013.01); *H01L 23/14* (2013.01); *H01L 23/528* (2013.01); *H05K 1/028* (2013.01); *H05K 1/0393* (2013.01); *H05K 1/118* (2013.01)

(58) Field of Classification Search
CPC ...... H05K 3/326; H05K 1/028; H05K 1/0393; H05K 1/118; H01L 23/14; H01L 23/528
(Continued)

(56) References Cited

U.S. PATENT DOCUMENTS

| 9,401,306 B2 | 7/2016 | Mahajan |
| 2014/0345924 A1 | 11/2014 | Allen |
| 2016/0323966 A1 | 11/2016 | Hamel |

FOREIGN PATENT DOCUMENTS

| WO | WO 2015-183264 | 12/2015 |
| WO | WO 2018-034914 | 2/2018 |

(Continued)

OTHER PUBLICATIONS

International Search Report for PCT International Application No. PCT/IB2019/057719, dated Jan. 9, 2020, 3 pages.

*Primary Examiner* — Tremesha S Willis
(74) *Attorney, Agent, or Firm* — Thomas M. Spielbauer

(57) ABSTRACT

Flexible devices including conductive traces with enhanced stretchability, and methods of making and using the same are provided. The circuit die is disposed on a flexible substrate. Electrically conductive traces are formed in channels on the flexible substrate to electrically contact with contact pads of the circuit die. A first polymer liquid flows in the channels to cover a free surface of the traces. The circuit die can also be surrounded by a curing product of a second polymer liquid.

20 Claims, 15 Drawing Sheets

(51) Int. Cl.
*H01L 23/528* (2006.01)
*H05K 1/02* (2006.01)
*H05K 1/03* (2006.01)
*H05K 1/11* (2006.01)

(58) Field of Classification Search
USPC .......................................................... 174/254
See application file for complete search history.

(56) References Cited

FOREIGN PATENT DOCUMENTS

| WO | WO 2018-094057 | 5/2018 |
| WO | WO 2019-171214 | 9/2019 |

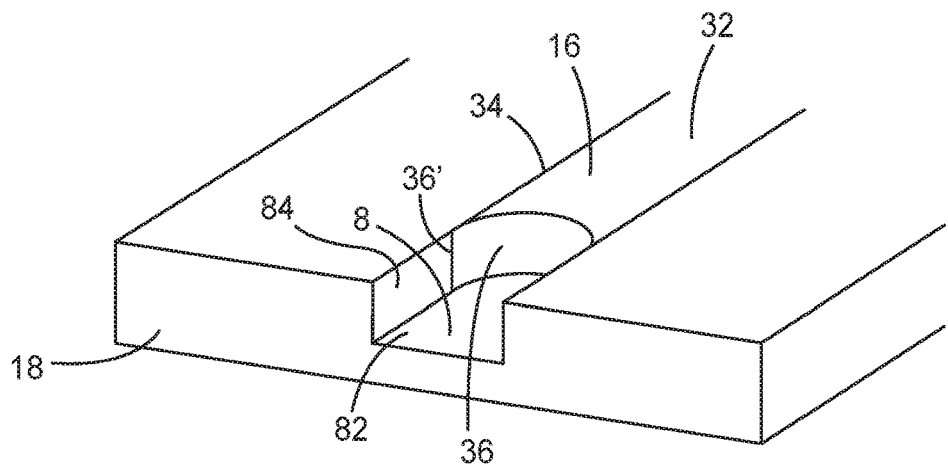
FIG. 3A
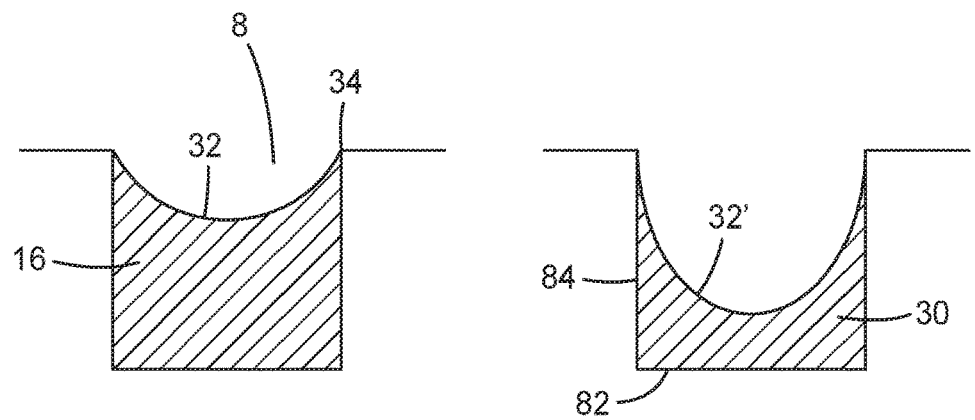
FIG. 3B
FIG. 3C
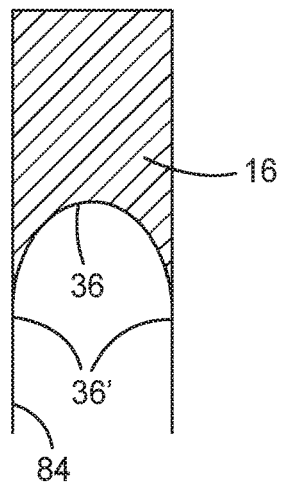
FIG. 3D

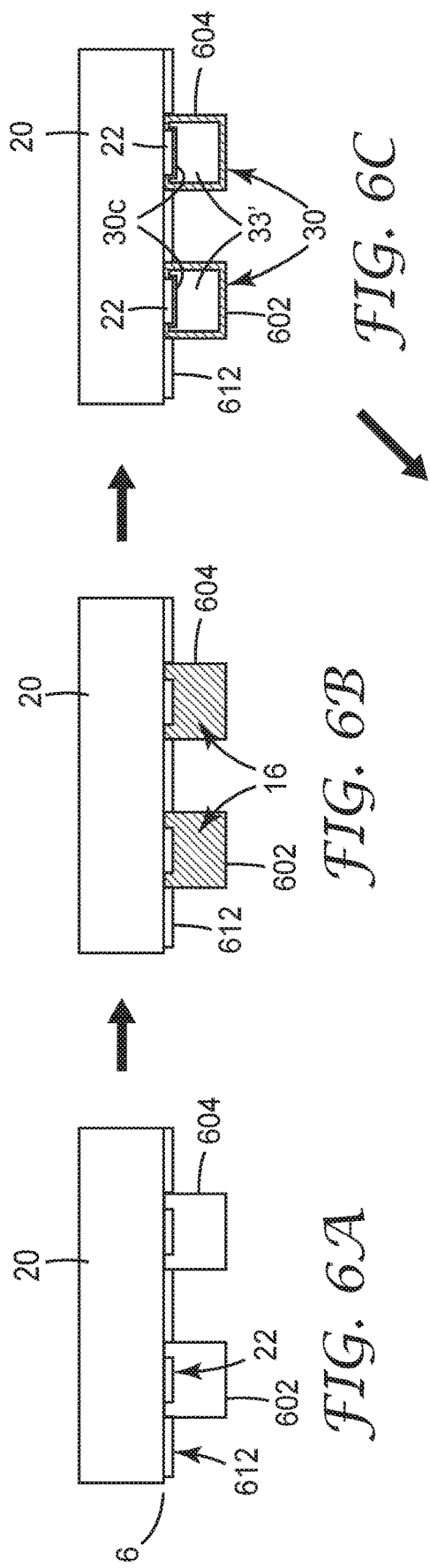

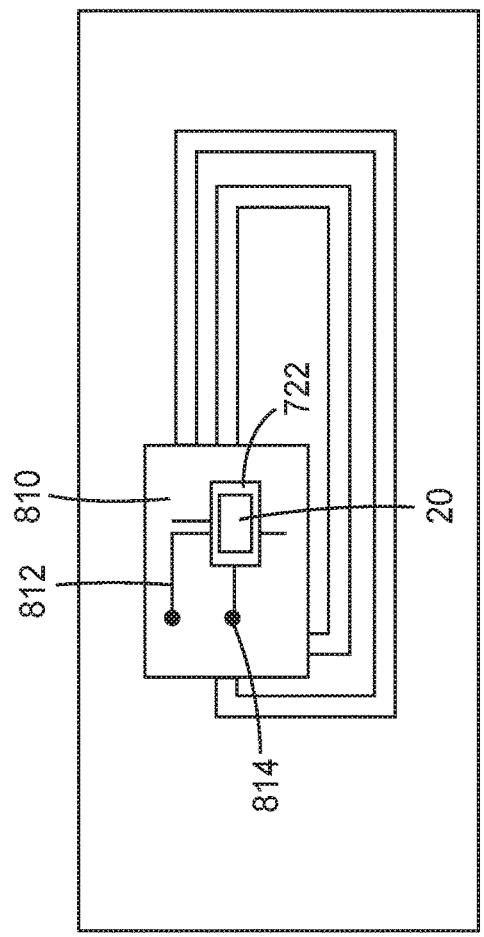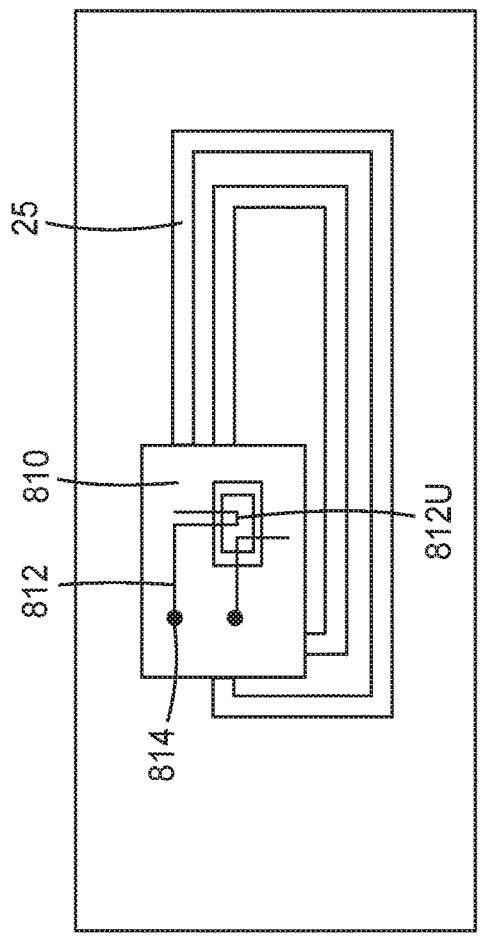

FLEXIBLE DEVICE INCLUDING CONDUCTIVE TRACES WITH ENHANCED STRETCHABILITY

CROSS REFERENCE TO RELATED APPLICATIONS

This application is a national stage filing under 35 U.S.C. 371 of PCT/IB2019/057719, filed Sep. 12, 2019, which claims the benefit of U.S. Application No. 62/732,280, filed Sep. 17, 2018; and U.S. Application No. 62/783,551, filed Dec. 21, 2018, the disclosure of which is incorporated by reference in its/their entirety herein.

TECHNICAL FIELD

The present disclosure relates to flexible devices including circuit dies with enhanced stretchability, and methods of making and using the same.

BACKGROUND

Integration of solid semiconductor dies with printing techniques combines the computational prowess of semiconductor technology with the high-throughputs and form-factor flexibility of web-based processes. However, a major hurdle in the flexible hybrid electronics manufacturing is the registration of semiconductor dies to electrically conductive traces on moving webs. Typical alignment mechanisms of wafer-based semiconductor devices may not be readily transferred to web-based processes.

SUMMARY

There is a desire to improve the stretchability, flexibility or bendability of flexible devices including solid circuit dies where a micrometer-level registration is achieved between the solid circuit dies and electrically conductive interconnects on a substrate, in particular, a moving, stretchy flexible substrate. Briefly, in one aspect, the present disclosure describes a method of making a flexible device. The method includes providing a flexible substrate including a registration area and one or more channels on a major surface thereof, the channels extending into the registration area; providing a solid circuit die on the registration area, the solid circuit die having one or more contact pads on a surface thereof; forming one or more electrically conductive traces in the channels to electrically contact with the contact pads of the solid circuit die; and flowing a first polymer liquid in the channels to cover a free surface of the electrically conductive traces.

In another aspect, the present disclosure describes a flexible device. The flexible device includes a flexible substrate including a registration area and one or more channels on a major surface thereof, the channels extending into the registration area; a solid circuit die disposed on the registration area, the solid circuit die having one or more contact pads on a surface thereof; one or more electrically conductive traces formed in the channels, the traces forming one or more electrical contacts with the contact pads of the solid circuit die; and a product of solidifying a first polymer liquid that covers a free surface of the electrically conductive traces. The product has a higher modulus than that of the flexible substrate.

Various unexpected results and advantages are obtained in exemplary embodiments of the disclosure. One such advantage of exemplary embodiments of the present disclosure is that flexible devices/circuits described herein can exhibit enhanced stretchability and flexibility. Electrically conductive traces in channels can be covered by flowing a polymer liquid in the channels, which can eliminate the respective free surfaces of the conductive traces and reinforce the electrical contacts between the conductive traces and contact pads of a circuit die. Also, when the circuit die is received in a pocket of a flexible substrate, the circuit die can be surrounded by a polymer material that has a higher modulus than that of the material forming the pocket. Such a gradient in moduli enables the flexible devices/circuits to be subjected to larger overall device strains without damaging or disconnecting operational components.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which:

FIG. 3A is a side perspective view of a portion of the substrate of FIG. 1 where a conductive liquid is provided to flow in the channel, according to one embodiment of the present disclosure.

FIG. 3B is a simplified cross-sectional view of the substrate of FIG. 3A where a conductive liquid is provided to flow in the channel, according to one embodiment of the present disclosure.

FIG. 3C is a simplified cross-sectional view of the substrate of FIG. 3A where the conductive liquid is solidified to form an electrically conductive trace, according to one embodiment of the present disclosure.

FIG. 3D is a simplified top view of the substrate of FIG. 3A where the conductive liquid is provided to flow in the channel, according to one embodiment of the present disclosure.

FIG. 6A is a cross-sectional view of an article including a circuit die disposed on a substrate, where channels on the substrate lead to contact pads on a bottom surface of the circuit die, according to one embodiment.

FIG. 6B is a cross-sectional view of the article of FIG. 6A, wherein a conductive ink flows into the channels, according to one embodiment.

FIG. 6C is a cross-sectional view of the article of FIG. 6B, wherein the conductive ink is solidified to form electrical contacts to the contact pads of the circuit die, according to one embodiment.

FIG. 6D is a cross-sectional view of the article of FIG. 6C, wherein a polymer liquid flows in the channels to fill a void space underneath the circuit die, according to one embodiment.

FIG. 8C is an exploded plan view of the flexible device 800 of FIG. 8A with the overcoat removed, according to one embodiment.

FIG. 8D is an exploded plan view of the flexible device 800 of FIG. 8A with the overcoat and the circuit die removed, according to one embodiment.

Figure 1:
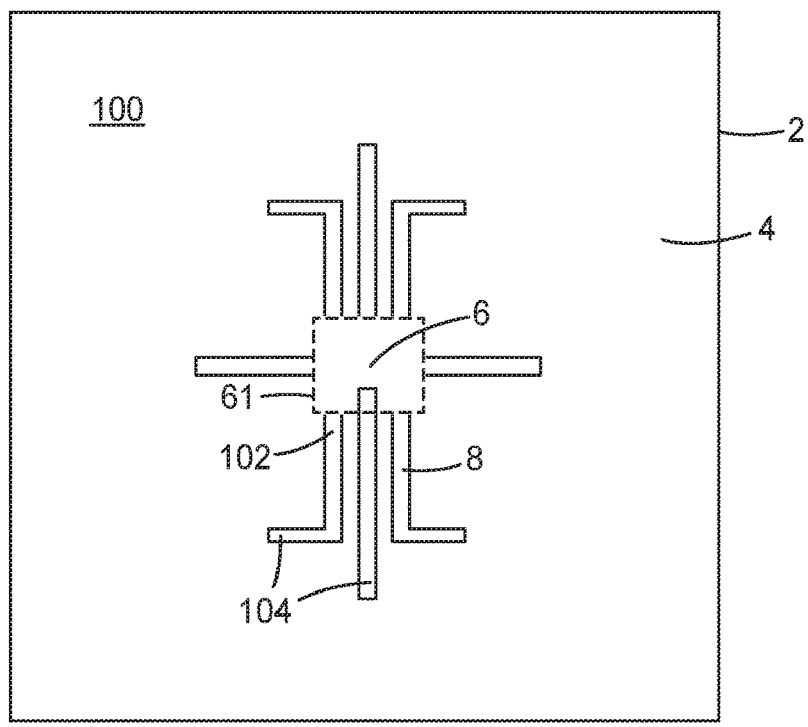
FIG. 1 is a top view of a substrate including multiple channels directed to a registration area to receive a solid circuit die, according to one embodiment of the present disclosure.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should be understood that:

The term "conductive liquid" refers to a liquid composition that is flowable in a channel via capillary force. The conductive liquid described herein can be solidified to form electrically conductive traces. The conductive liquid may include any suitable electronic material having properties desired for use in forming electrically conductive traces.

The term "liquid adhesive" refers to a liquid composition including a liquid carrier and one or more adhesives. The liquid adhesive described herein can be solidified to form an adhesive layer.

The term "modulus" refers to Young's modulus which is a measure of the ability of a material to withstand changes in length when under lengthwise tension or compression. Sometimes Young's modulus may be referred to as the modulus of elasticity which is equal to the longitudinal stress divided by the strain. A solid material may undergo elastic deformation when a small load is applied to it in compression or extension. Elastic deformation is reversible (i.e., the material returns to its original shape after the load is removed). At near-zero stress and strain, a stress-strain curve can be linear, and the relationship between stress and strain is described by Hooke's law that states stress is proportional to strain. The coefficient of proportionality is Young's modulus. The higher the modulus, the more stress is needed to create the same amount of strain; an idealized rigid body may have an infinite Young's modulus.

The term "adjoining" with reference to a particular layer means joined with or attached to another layer, in a position wherein the two layers are either next to (i.e., adjacent to) and directly contacting each other, or contiguous with each other but not in direct contact (i.e., there are one or more additional layers intervening between the layers).

By using terms of orientation such as "atop", "on", "over," "bottom," "up," "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture.

The terms "about" or "approximately" with reference to a numerical value or a shape means+/− five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5). Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

FIG. 1 illustrates a top view of an article 100. The article 100 includes a substrate 2. The substrate 2 has a structured major surface 4. In some embodiments, the substrate 2 can be a flexible substrate, for example, a web of indefinite length polymeric material. The flexible substrate or web may be stretched (e.g., along a machine direction and/or a cross direction) when moving along a web path. One or more channels 8 are formed on the major surface 4. The channels 8 each extend between a first end 102 and a second end 104, and extend toward a registration area 6 which is configured to receive a solid circuit die.

In the depicted embodiment of FIG. 1, at least one of the first ends 102 of the channels 8 extends beyond the respective edge 61 of the registration area 6 such that the channel 8 extends into the registration area and has a portion at the first end 102 underneath the bottom surface of the received solid circuit die. In some embodiments, the registration area 6 may include a pocket formed on the major surface 4. In some embodiments, a pocket may be a cavity including a bottom surface and one or more side walls. At least one of the channel 8 can extend into the cavity, e.g., extending across the side wall and having the first end 102 thereof formed on the bottom surface of the pocket. It is to be understood that a pocket may have a bottom surface coplanar to the major surface 4 of the substrate. In general, a pocket described herein refers to an area on the substrate that is capable of receiving a circuit die.

The channels 8 are configured to allow fluid to flow primarily via a capillary force, for example, from the second end 104 toward the first end 102. In some embodiments, at least one of the channels 8 or at least a portion of one channel may be open on the upper surface. In some embodiments, at least one of the channels 8 or at least a portion of one channel may be enclosed by an upper wall. While one registration area and eight channels are shown in the embodiment of FIG. 1, it is to be understood that any other numbers of pockets and/or channels can be formed on the substrate.

In some embodiments, the features (e.g., the channels 8 or the registration area 6) on the substrate 2 can include indentations formed into the major surface 4 thereof. In some embodiments, the features (e.g., the channels 8 or the registration area 6) on the substrate 2 can include embossments projecting from the major surface 4 thereof. In some embodiments, the features (e.g., the channels 8 or the registration area 6) can be formed by adding materials on the major surface 4. In some embodiments, the registration area 6 may be a portion of the major surface 4 of the substrate 2 that is coplanar to other portions of the major surface 4. In some embodiments, one or more registration marks or fiducials can be formed on the registration area 6. When a solid circuit die is received on the registration area 6, the registration marks or fiducials can be used to register the solid circuit die with the substrate 2 and the channels 8. The features (e.g., the channels and the registration area 6) can be formed by any suitable techniques including, for example, microreplication, hot embossing, molding, soft lithography, etching, 3D printing, etc.

In some embodiments, the features (e.g., the channels 8 or a pocket in the registration area 6) may be made of the same material as the substrate 2. The material of a channel may refer to as a channel material. The material of a pocket may refer to as a pocket material. In some embodiments, the channel material or the pocket material may be different from the substrate material.

In some embodiments, the features (e.g., the channels 8 or a pocket in the registration area 6) may have substantially the same depth. The top or bottom surfaces of the adjacent features on the substrate 2 may be substantially coplanar. In some embodiments, the features may have different depths. The top or bottom surfaces of the adjacent features may not be coplanar. For example, one or more steps may be formed at an edge where a channel is connected to a pocket.

In some embodiments, the substrate 2 may be a flexible substrate, for example, a web of indefinite length material being conveyed through a web path. The flexible substrate may include, for example, polyethylene terephthalate (PET), polyethylene, polystyrene, polyurethane etc. The processes described herein can be carried out on a roll-to-roll apparatus including one or more rollers to convey the web along the web path. It is to be understood in some embodiments, a portion of the substrate 2 may be rigid, made of materials including, for example, bakelite, acrylonitrile butadiene styrene (ABS), cured epoxy systems, etc. It is to be understood that the substrate 2 as a whole can be flexible and stretchable.

The substrate 2 may have a thickness of, for example, 2 mm or less, 1 mm or less, 500 micrometers or less, or 200 micrometers or less. The features (e.g., a channel, a pocket, etc.) formed on the major surface 4 may have a minimum dimension of, for example, 500 micrometers or less, 300 micrometers or less, 100 micrometers or less, 50 micrometers or less, or 10 micrometers or less.

Figure 2:
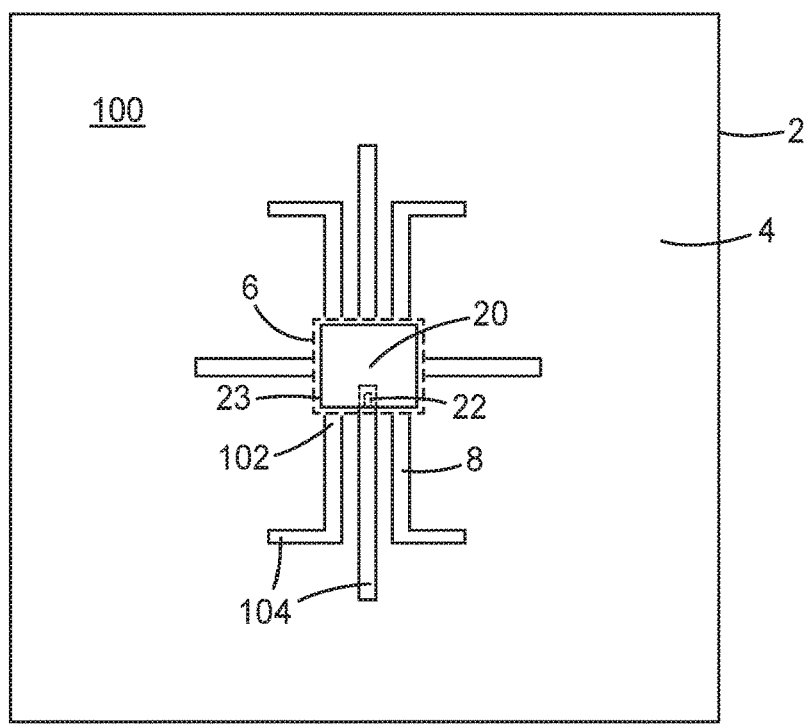
FIG. 2 is a top view of the substrate of FIG. 1 where the solid circuit die is disposed on the registration area, according to one embodiment of the present disclosure.

The registration area 6 is configured to receive a solid circuit die 20 as shown in FIG. 2. The solid circuit die 20 includes one or more contact pads 22 disposed on the bottom surface 20b (see FIG. 4B). In some embodiments, the contact pads 22 may be partially embedded in the circuit die 20 and have an exposed surface or portion adjacent to the edges 23 of the circuit die 20. The contact pads of the circuit die 20 may be made of any suitable electrically conductive materials such as, for example, metals. It is to be understood that the contact pads may vary with the specific types of circuit dies. Some contact pads may include protrusions, pegs, or legs sticking out of a casing of the circuit die. Some contact pads may include electroplated metals (e.g., Cu/Au) on the surface of the circuit die casing. In some embodiments, contact pads may include metal bumps directly on the bare die surface.

In many applications, a solid circuit die may have its contact pads disposed on a surface thereof, e.g., a top or bottom surface, or a side surface. When a circuit die is disposed inside a pocket on a substrate, the circuit die can be positioned to have the major surface with the contact pads facing down, i.e., having the contact pads in contact or close proximity with the bottom surface of the pocket. One or more channels formed on the substrate can extend into the pocket and reach the bottom contacts of the circuit die. Electrically conductive traces can be formed in the channels and extend to be in direct contact with the bottom contact pads of the solid circuit die.

Referring again to FIG. 2, when the circuit die 20 is disposed at the registration area 6, the contact pads 22 at the edges 23 of the circuit die 20 may be aligned with respect to the respective channels 8. To reach a contact pad on a bottom surface of the circuit die, the first end 102 of the channel 8 can extend into the registration area 6 and has a portion underneath the corresponding contact pad such that fluid flowing in the channel can be automatically directed, primarily via a capillary force, to the corresponding contact pads.

In some embodiments, a contact pad and a channel can be aligned such that the contact pad may have an exposed surface or portion that directly faces the first end 102 of a channel. For example, FIG. 4B shows the contact pads 22 formed on the bottom surface 20b of the circuit die 20 that may directly face the first ends 102 of the respective channels 8a and 8c. For example, FIG. 4E shows the contact pads 22 formed on the side surface 26 of the circuit die 20 that may directly face the corresponding channel 8b.

In some embodiments, a contact pad may have a portion that faces a channel. In some embodiments, a contact pad may not directly face a channel. Instead, the contact pad and the channel can be aligned such that a fluid path can fluidly connect the channel to the corresponding contact pad. Fluid can flow in the channel through the fluid path toward the contact pad and directly connect to that contact pad. It is to be understood that the contact pads and the channels may not have a one-to-one correspondence. The contact pads and the channels can be aligned such that fluid flow in one or more channels may be directed to one or more predetermined contact pads.

In some embodiments, the contact pads 22 may have a width that substantially matches the width of the channels 8. In some embodiments, the channels may have a width greater than that of the contact pads aligned with the channels. The channel may have a width, for example, about 10%, about 30%, about 50%, about 70%, or about 90% greater than the width of the contact pad on the circuit die. For example, when the contact pad is about 200 micrometers wide, the channel can be chosen to be about 300 micrometers wide. A wider channel may allow an electrically conductive trace formed therein to substantially cover the contact pad and provide superior electrical contacts therebetween.

The circuit die 20 can include a circuit chip having one or more contact pads arranged along the edges 23 thereof. In some embodiments, the circuit die 20 can include a rigid semiconductor die. In some embodiments, the circuit die 20 can include a printed circuit board (PCB). In some embodiments, the circuit die 20 can include a flexible printed circuit (FPC). It is to be understood that the circuit die 20 can be any suitable circuit dies to be disposed on a substrate, of which one or more contact pads are to be registered and connected to electrically conductive traces on the substrate.

In some embodiments, when the circuit die 20 is received by a pocket at the registration area 6, the circuit die 20 may have a thickness substantially the same as the depth of the pocket or the depth of the channel. In some embodiments, the depth of the pocket may be such that the bottom of the solid circuit die within the pocket is positioned approximately at the neutral bending plane of the neutral construction.

In some embodiments, the circuit die 20 may be an ultra-thin chip with a thickness of, for example, about 2 micrometers to about 200 micrometers, about 5 micrometers to about 100 micrometers, or about 10 micrometers to about 100 micrometers. The depth of a pocket to receive the circuit die can be, for example, 2 times, 4 times, 6 times, 8 times, or 10 times greater than the thickness of circuit die. The depth of the pocket may be such that when the solid circuit die is attached to the bottom surface of the pocket, the solid circuit die may extend substantially along the neutral bending plane of the neutral construction. This arrangement may effectively reduce strain on the solid circuit die when the substrate bends.

In some embodiments, the ultra-thin circuit die may be loaded on a handle substrate to facilitate the disposition onto the registration area 6. The handle substrate can be removed after the circuit die 20 is received at the registration area 6.

In some embodiments, the circuit die 20 can be attached to the surface of the registration area 6 via an adhesive. When the registration area 6 includes a pocket, the circuit die 20 can be attached to the bottom surface of the pocket by the adhesive. Exemplary adhesives may include structural adhesives, acrylic adhesives, epoxy adhesive, urethane adhesives, optical adhesives, etc. In some embodiments, the adhering can be performed with, for example, a UV curable polyurethane compound. The adhesive can be precisely applied to attach the circuit die 20 onto the surface of the registration area 6 without blocking the channels 8. See also FIG. 4B, where the circuit die 20 is attached to the surface of the substrate 2 via an adhesive layer 12.

Figure 4A:
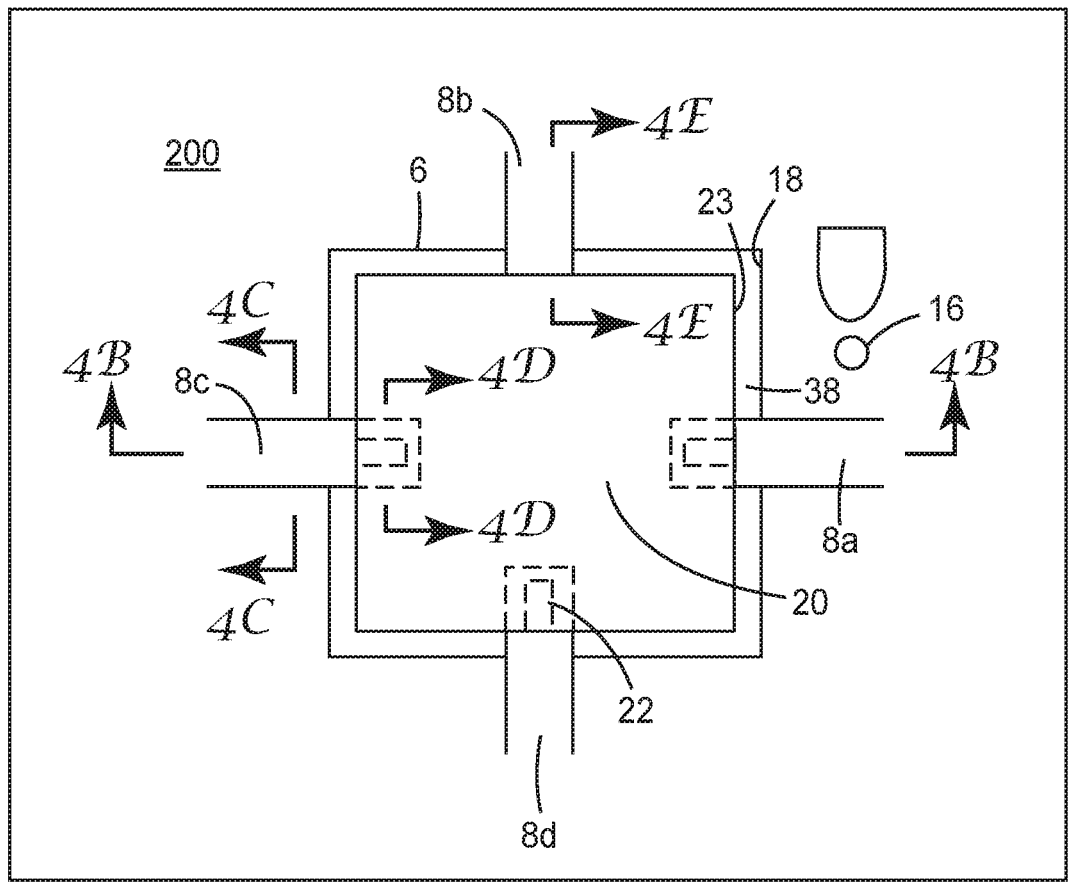
FIG. 4A is a top view of an article including a circuit die disposed on a substrate where a conductive liquid is provided to the channels to form electrically conductive traces and a first polymer liquid flows in the channels to cover the traces, according to one embodiment of the present disclosure.
Figure 4B:
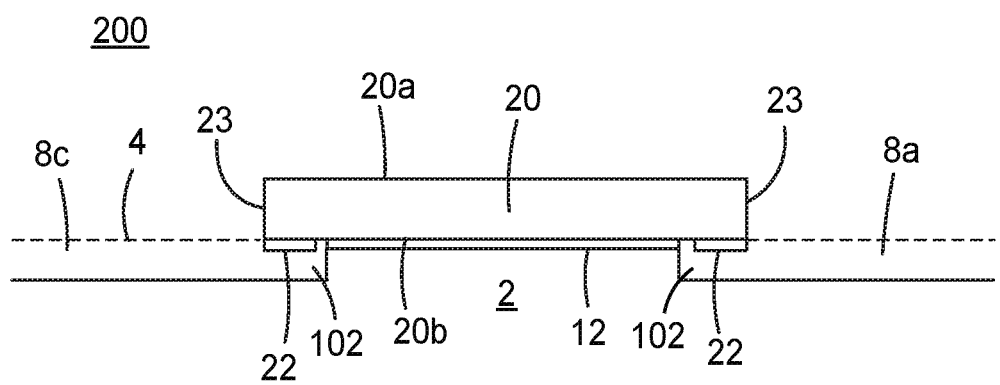
FIG. 4B is a cross-sectional view of the article of FIG. 4A along the cross line 4B-4B.
Figure 4C:
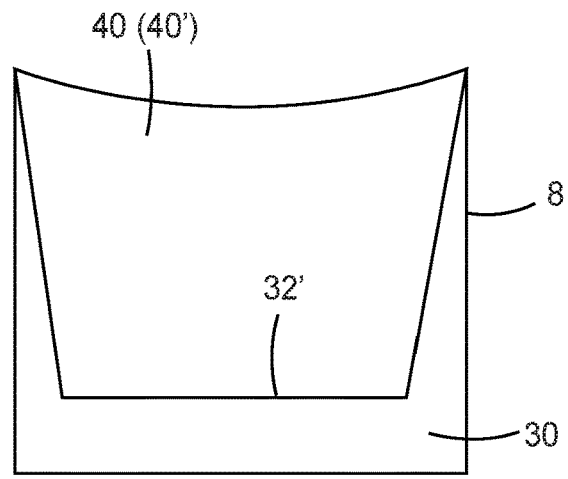
FIG. 4C is a cross-sectional view of the article of FIG. 4A along the cross line 4C-4C.

As shown in FIG. 4A, when the circuit die 20 is disposed at the registration area 6, a conductive liquid 16 can be dispensed into the one or more channels 8a, 8b, 8c or 8d. The conductive liquid 16 can be a liquid composition that is flowable in the channels 8 primarily by a capillary force. The conductive liquid 16 may include, for example, a liquid carrier and one or more electronic material, a liquid metal or metal alloy, etc. The conductive liquid described herein can be solidified to leave a continuous layer of electrically conductive material that forms an electrically conductive trace in the channel. Suitable liquid compositions may include, for example, silver ink, silver nanoparticle ink, reactive silver ink, copper ink, conductive polymer inks, liquid metals or alloys (e.g., metals or alloys that melt at low temperatures and solidify at room temperatures), etc.

The conductive liquid 16 can be delivered into the channels 8 by various methods including, for example, ink jet printing, dispensing, micro-injection, etc. In some embodiments, one or more reservoirs can be provided to be adjacent and in fluid communication with the channel 8. The reservoirs can be shaped to provide a convenient receptacle for the dispensed conductive liquid. The conductive liquid 16 can be disposed into the reservoirs by, for example, ink jet printing, dispensing such as piezo dispensing, needle dispensing, screen printing, flexo printing, etc. The conductive liquid 16 can move, by virtue of a capillary force, from the reservoirs to the channels 8. The reservoir may have a depth that is substantially the same as the depth of the channels 8. The reservoir can have any desirable shapes and dimensions that are suitable for receiving the conductive liquid 16. In some embodiments, the reservoir may have a dimension in a range, for example, from about 1 micrometer to about 1.0 mm, from about 5 micrometers to about 500 micrometers, or from about 50 micrometers to about 500 micrometers. It is to be understood that in some embodiments, a conductive liquid can be provided into a channel without using a reservoir.

In some embodiments, the conductive liquid 16 can be directly disposed on the surface area adjacent to the channel 8. Then the conductive liquid 16 can be automatically collected, via a capillary force, by the channel 8 from the surrounding area. In some embodiments, the surrounding area of the second end 104 can be selectively treated or patterned to enhance the collection of the conductive liquid 16 into the second end 104 of the channel 8. Suitable surface treatment or patterning methods may include, for example, microreplication, flexo printing, screen printing, gravure printing, etc. It is to be understood that any suitable methods can be used to deliver the conductive liquid 16 into a distal end of the channels 8. The conductive liquid 16 can be deposited in any suitable manner, such as, for example, printing, pouring, funneling, micro-injecting, etc.

When the conductive liquid 16 is delivered into the channel 8, the conductive liquid 16 can be routed, mainly by virtue of a capillary force, through the channel 8, for example, from the second, distal end 104 toward the first end 102. In some embodiments, the conductive liquid 16 can be provided to fill the channel 8 from a point between the distal end 104 and the first end 102. While not wanting to be bounded by theory, it is believed that a number of factors can affect the ability of the conductive liquid 16 to move through the channel 8 via capillarity. Such factors may include, for example, the dimensions of the channels, the viscosity of the conductive liquid, surface energy, surface tension, drying, etc. The factors were discussed in U.S. Pat. No. 9,401,306 (Mahajan et al.), which is incorporated herein by reference.

The channel 8 can have any suitable dimensions (e.g., width, depth, or length) which can, in part, be determined by one or more of the factors described above. In some embodiments, the channel 8 may have a width or depth in a range, for example, from about 0.01 micrometers to about 500 micrometers, from about 0.05 micrometers to about 200 micrometers, or from about 0.1 micrometers to about 100 micrometers.

Referring to FIGS. 3A-D, when the conductive liquid 16 moves, via capillarity, into the channel 8 from the second end 104 toward the first end 102, the side walls 84 and the bottom wall 82 of the channel 8 can be wetted by the conductive liquid 16 to form one or more curved menisci. It is to be understood that the conductive liquid 16 may be delivered with an amount that covers a portion of the side walls 84 adjacent to the bottom walls 82. The upper surface 32 of the conductive liquid 16 has a convex crescent shape. The edges 34 of the upper surface 32 may serve as pinned contact lines during the flow of the ink 16. The front surface 36 of the ink 16 also has a convex crescent shape. The edges 36' of the front surface 36 may serve as leading edges directing the flow forward. The formation of the menisci may generate a pressure gradient that can drive the flow down the capillary with viscous resistance provided by the friction at the capillary walls.

The conductive liquid 16 inside the channel 8 can be solidified to form an electrically conductive trace 30 deposited in the channel and in direct contact to the contact pads on the bottom surface 20b of the circuit die 20. The electrically conductive trace 30 has a free surface 32'. See also FIGS. 4B-E. Suitable processes that can be used to enhance the solidification of the conductive liquid 16 may include, for example, curing or evaporating by heat or radiation. During the process of solidification, the pinned contact line 34 may initiate liquid flow from the center of the channel 8 toward the side walls 84. The volume of the conductive liquid 16 may be decreased by removing the liquid carrier therefrom. The thickness of the deposited solid material may depend on the solid loading of the conductive liquid 16. In some embodiments, the deposited solid material may have a thickness of, for example, from about 0.01 micrometers to about 200 micrometers, from about 0.05 micrometers to about 100 micrometers, or from about 0.1 micrometers to about 10 micrometers.

When the conductive liquid 16 moves, via capillarity, in the channel 8 and arrives at the first end 102 thereof, the conductive liquid 16 can wet the portion of the circuit die 20 that is exposed to the channel 8. The conductive liquid 16 can wet and spread to cover the corresponding contact pads 22 disposed on a surface of the circuit die 20.

In some embodiments, the registration area 6 may be a pocket, the side surface 23 of the circuit die 20 and the side wall 18 of the pocket 6 may have a gap 38 formed therebetween, as shown FIG. 4A. The gap 38 may facilitate the installing of the circuit die 20 into the pocket 6. In some embodiments, the gap 38 may have a width of, for example, about 10 to about 500 micrometers, about 10 to about 200 micrometers, or about 10 to about 100 micrometers. When the conductive liquid 16 flows in the channel 8 and into the registration area 6, the edges of the upper surface of the conductive liquid can still serve as pinned contact lines and prevent a portion of the conductive liquid 16 from flowing into the gap 38. See also FIGS. 3A and 3B.

Figure 4D:
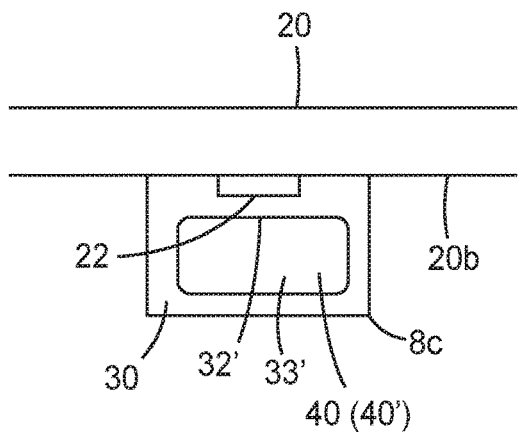
FIG. 4D is a cross-sectional view of the article of FIG. 4A along the cross line 4D-4D.
Figure 4E:
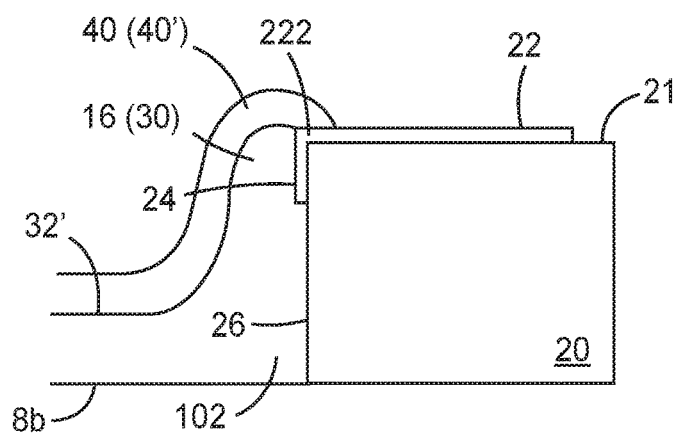
FIG. 4E is a cross-sectional view of the article of FIG. 4A along the cross line 4E-4E.

Referring to FIGS. 4B and 4D, when the edges of the upper surface of the conductive liquid meet the bottom surface 20b of the circuit die 20, the conductive liquid 16 can wet the portion of the bottom surface 20b of the circuit die 20 that is exposed to the channel 8. The conductive liquid 16 can wet and spread to cover the contact pad 22 on the bottom surface 20b of the circuit die 20. In this manner, electrically conductive traces 30 can be formed in the channels that are in direct contact with the contact pads of the solid circuit die 20. When the channel 8 extends to be underneath the circuit die 20, the electrically conductive trace 30 can be in direct contact to the contact pad 22 on the bottom surface 20b of the circuit die 20, while the free surface 32' may form a void space 33' that is underneath the circuit die 20. See FIG. 4D.

Referring to FIG. 4E, when the conductive liquid 16 moves, via capillarity, in the channel 8b and arrives at the first end 102, the front surface of the conductive liquid 16 can wet the side surface 26 of the circuit die 20 that is exposed to the channel 8. The conductive liquid 16 can wet and spread on the exposed portion 26 to cover the side contact pad portion 24, and continue to move onto the edge of the major surface 21 to cover the edge portion 222 of the contact pad 22 on the major surface 21. In some embodiments, the front surface of the conductive liquid 16 can be pinned at the edge portion 222 of the contact pad 22. The conductive liquid 16 may not move further onto the major surface 21 of the circuit die 20, which may leave a major portion of the contact pad 22 not covered by the conductive liquid 16. After solidification, the electrically conductive trace 30 can be formed with the free surface 32'.

In some embodiments, the substrate can have a registration feature shaped to receive the electronic component, and at least one channel shaped to extend toward an area that corresponds with one of the contacts when the electronic component is disposed within the registration feature. A conductive liquid can be dispensed within the channel such that the conductive liquid flows by a capillary force in the channel toward and wets the contacts. The conductive liquid can be solidified to form a conductive trace in the channel. In some embodiments, the at least one channel further includes an enlarged portion shaped to provide a convenient receptacle for the dispensed adhesive ink or conductive liquid. For example, one end of the channel can be fluidly connected to a reservoir to facilitate liquid delivery.

In the present disclosure, the liquid or ink delivered into the channels can automatically register with the circuit dies by wetting out, via a capillary force, various surfaces of registration features and circuit dies on the substrate (e g, channel walls, side walls of the pocket, side surfaces of the circuit die, etc.). The flow of liquid on the various capillary surfaces can be automatically directed by a capillary force, eliminating the necessity of using fluid pumps to pump the fluid toward the circuit die. After the automatic registration, the liquid or ink can be further solidified or dried to form a solid, continuous layer. The process can be repeated to form a multilayer structure aligned with the solid circuit die on the substrate.

In some embodiments, when electrically conductive traces are formed and automatically registered with contact pads on circuit dies, the traces can be connected to other portions of a circuit or other circuits or devices. In some embodiments, additional metal traces (e.g., Cu traces) can be patterned in registration to the electrically conductive traces. In some embodiments, the electrically conductive traces can be connected to an antenna coil of an electronic device such as a receiver or transmitter. The processes described herein can be used to make various chip-based circuits/devices including, for example, radio-frequency identification (RFID) tags, near field communication (NFC) circuits, Bluetooth circuits, Wi-Fi circuits, microprocessor chips, etc.

There is a desire to improve the stretchability, flexibility or bendability of the above chip-based circuits/devices because the electrically conductive traces in the channels may crack when the circuits/devices are subjected to a bending or rotational stress or strain. In some embodiments, a void space (e.g., the void space 33' underneath the circuit die 20 in FIG. 4D) near the electrical contacts between the conductive traces and contact pads of the circuit die may make the electrical contacts more vulnerable to stress or strain implications. In the present disclosure, backfilling the channels with a product of solidifying a polymer liquid can reinforce the conductive traces in the open channels where the free surface of the traces can be covered. Flowing the polymer liquid in the channels allows it to flow into the void space underneath the circuit dies to at least partially fill the void space, which can reinforce the electrical contacts formed between the traces and the contact pads of the circuit die. The circuits/devices that have been backfilled with a curable polymer can eliminate the free surface of the conductive traces and the void space underneath the circuit die such that the circuits/devices can resist cracking at much higher overall strains. Therefore, the flexible devices including circuit dies described herein can exhibit an enhanced stretchability, flexibility and bendability.

Referring again to FIGS. 4C-E, with the formation of electrically conductive traces 30 in the channels 8, the electrically conductive trace 30 has a free surface 32' which may have a crescent shape in the channel. A first polymer liquid 40 is then provided into the channels 8 to flow, primarily by a capillary force, in the channels to cover the free surface 32' of the electrically conductive traces 30. The first polymer liquid 40 can be delivered into the channels 8 by various methods including, for example, ink jet printing, dispensing, micro-injection, coating, etc.

As shown in FIG. 4D, the circuit die 20 has a contact pad 22 on a bottom surface 20b thereof. The channel 8c extends beneath the bottom contact pad 22. When the first polymer liquid 40 flows into the void space 33' underneath the circuit die 20, the polymer liquid 40 can wet and spread on the free surface 32' of the electrically conductive trace 30 to at least partially fill the void space 33'. As shown in FIG. 4E, the contact pad 22 has a side portion 24 disposed on the side surface 26 of the circuit die 20. When the first polymer liquid 40 flowing in the channel 8b approaches the side surface 26 of the circuit die 20, the first polymer liquid 40 can wet and spread on the free surface 32' of the electrically conductive trace 30 to cover the electrical contact formed between the trace 30 and the side portion 24 of the contact pad 22 adjacent to the edge portion 222 of the contact pad 22. In some cases, the first polymer liquid 40 may wet and spread on the contact pad 22 on the major surface 21 of the circuit die 20.

In some embodiments, the first polymer liquid may include, for example, a UV curable polymer. Exemplary polymer liquid may include UV acrylates, heat curable epoxy, 2-part epoxy, etc. In some embodiments, the first polymer liquid may include a poly (thiol-ene) which can be made by the free radical polymerization of multifunctional thiols and multifunctional enes (vinyl terminated compounds). In one example prepared in the present application, the first polymer liquid was an optical adhesive commercially available from Norland Products, Inc. (CRANBURY, N.J., USA) under the trade designation NOA-73.

The first polymer liquid 40 can then be solidified to form a product 40'. Suitable processes that can be used to enhance the solidification of the first polymer liquid 40 may include, for example, curing or evaporating by heat or radiation. In some embodiments, the first polymer liquid can include a UV curable polymer, and the polymer layer 40' can be a product of curing the UV curable polymer. The channels 8 can be at least partially filled by the product 40'. In some embodiments, at least 50%, at least 60%, at least 70%, at least 80%, or at least 90% volume of the channel 8 can be filled with the product 40'.

In some embodiments, a product of curing a UV curable polymer may have a modulus in the range, for example, between 0.1 MPa to 10 GPa. The pocket material may include, for example, an acrylate, urethane, silicone, or epoxy which can have moduli in the range, for example, between 0.1 MPa to 10 GPa. In some embodiments, the product 40' has a higher modulus than that of the material forming the channels 8 on the flexible substrate 2. In some embodiments, a product of curing a UV curable polymer may have a modulus in the range of, for example, between 0.1 MPa to 10 GPa. The channel material may include, for example, an acrylate, urethane, silicone, or epoxy which can have moduli in the range, for example, between 0.1 MPa to 10 GPa. In some embodiments, the channel material may include a poly (thiol-ene) which can be made by the free radical polymerization of multifunctional thiols and multifunctional enes (vinyl terminated compounds).

In some embodiments, the material filling the channels or pockets (e.g., the product 40') may have a preferred upper limit for its elastic modulus. When the modulus is greater than the upper limit, the filling material may have a low elongation to break. Elongation at Break, also known as fracture strain or tensile elongation at break, is the ratio between increased length and initial length after breakage of the material at a specific temperature. It is related to the ability of a material to resist changes of shape without cracking. For example, a filling material having its modulus greater than a predetermined upper limit may break when the flexible substrate is bent to a certain level.

In some embodiments, during bending of a substrate having a thickness H to a bending radius R, the outer surface of the substrate may experience a strain that is approximately H/(2*R). When a backfilled channel or pocket is on the outside of the substrate, a material (e.g., a polymer) used for backfilling needs to withstand that amount of strain without breaking. That means that the filling material may require an elongation to break that is larger than a certain value. When a substrate thickness is 25 micrometers, 50 micrometers, 100 micrometers, 200 micrometers, or 1000 micrometers, the corresponding required bending radius can be 1 mm, 5 mm, 10 mm, 25 mm, 50 mm, 100 mm, and the corresponding required elongation to break can be greater than 2%, 3%, 5%, 10%, or even 100%. In general, filling materials (e.g., polymers) with higher modulus may have lower elongation to break. A choice of backfill material for an application requiring certain elongation in stretching or bending to a certain radius, and having certain substrate thickness, needs to include a balance between modulus and elongation to break.

Figure 5:
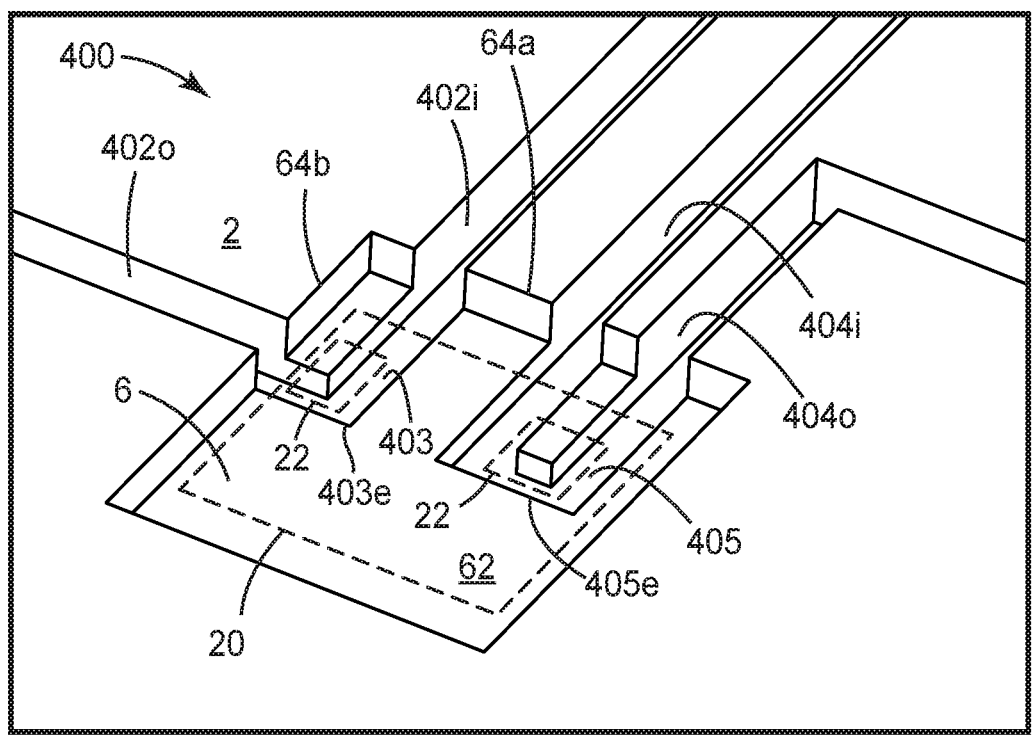
FIG. 5 is a perspective view of an article including an inlet channel and an outlet channel fluidly connected inside a pocket, according to one embodiment.

In some embodiments, fluid channels on a flexible substrate may include an inlet channel and an outlet channel that are fluidly connected. The first polymer liquid can flow into the inlet channel, wet and spread on a free surface of an electrically conductive trace in the channel FIG. 5 is a perspective view of an article 400 including one or more pairings of inlet and outlet channels formed on the substrate 2, according to one embodiment. A pairing of inlet channel 402i and outlet channel 402o each extends across the side wall 64a or 64b into the pocket 6, having the respective ends fluidly connected inside the pocket 6 to form an inner channel 403. The inner channel 403 has an "L" shape. Another pairing of inlet channel 404i and outlet channel 404o each extends across the side wall 64a into the pocket 6, having the respective ends fluidly connected inside the pocket 6 to form an inner channel 405. The inner channel 405 has a "U" shape. While the embodiment of FIG. 5 illustrates a pairing of inlet and outlet channels fluidly connected inside the pocket, it is to be understood that in some embodiments, two or more inlet channels can be fluidly connected to one outlet channel; in some embodiments, one inlet channel can be fluidly connected to two or more outlet channels. It is also to be understood that some inlet or outlet channels are not fluidly connected to avoid a short circuit between different contact pads. In some embodiments, the channels may have a width, for example, in a range from about 5 to about 500 micrometers.

When a circuit die is disposed into the pocket 6, the bottom contacts of the circuit die can be aligned with a portion of the inner channel 403 or 405. A conductive liquid can flow, primarily by a capillary force, in the inlet channel 402i or 404i into the inner channel 403 or 405 to make direct contact with the bottom contact pads of the solid circuit die. Excess liquid can flow out of the pocket via the outlet channel 402o or 404o. The inlet and outlet channels (e.g., 402i and 402o, or 402i and 402o) are fluidly connected via the respective inner channels (e.g., 403 or 405), which can help to ensure a continuous liquid flow without trapping air in the inner channels. In this manner, robust contacts can be formed between the conductive liquid and the bottom contact pads of the solid circuit die.

As shown in FIG. 5, at least a portion of the inner channel 403 or 405 extends underneath the circuit die 20 where electrical contacts are formed between the contact pads 22 and the conductive liquid in the inner channel 403 or 405. It is to be understood that an inner channel (e.g., 403 or 405) formed by fluidly connecting an inlet channel and an outlet channel can have various configurations or shapes such as, for example, a "U" shape, an "L" shape, a straight-line shape, a curved-line shape, etc., so that the electrically conductive traces formed therein can have robust contact with the bottom contact pads 22 of the circuit die 20.

In some embodiments, the inner channel 403 or 405 can be shaped such that the bottom contact pads 22 of the circuit die 20 are positioned within the respective outer edges 403e and 405e of the inner channels 403 and 405. When the circuit die 20 is attached to the bottom surface 62 of the pocket 6 via a liquid adhesive, the outer edges 403 and 405e of the channels can stop the movement (e.g., by pinning) of the liquid adhesive (e.g., from a central portion of the pocket 6 towards the contact pads 22) and prevent possible contamination to the contact pads 22.

In some embodiments, a conductive liquid can flow into the channels (e.g., the inner channel 403 or 405) via the inlet channels (e.g., 402i or 404i), and solidify to form electrically conductive traces therein. For example, the electrically conductive traces can be formed by evaporation of a solvent of liquid conductive ink. During a solidification process, the conductive material can be deposited on the side walls and bottom of the channels, and on a portion of the bottom face of the circuit die sitting atop the channel. In the process, the conductive material can make a conformal contact with the contact pads on the circuit die. The solidification process may leave some void space in the channels underneath the circuit die. See, e.g., the void space 33' in FIG. 4D. The void space can be filled by flowing a first polymer liquid into the channels via the inlet or outlet channel. The first polymer liquid can wet and spread on the free surface of the electrically conductive trace(s) in the channel(s), primarily by a capillary force, flow into the void space, and at least partially fill the channels and the void space.

In the depicted embodiments of FIG. 5, the registration area 6 includes a pocket or cavity. It is to be understood that the registration area 6 can have other configurations. In some embodiments, the registration area 6 may be a portion of the major surface 4 of the substrate 2 that is coplanar to other portions of the major surface 4. In some embodiments, one or more registration marks or fiducials can be formed on the registration area 6. When a solid circuit die is received on the registration area 6, the registration marks or fiducials can be used to register the solid circuit die with the substrate 2 and the channels 8.

In some embodiments, a circuit die can be attached to the registration area 6 via a liquid adhesive. In some embodiments, the liquid adhesive can be provided into a fluid channel at the registration area for die adhering. In some embodiments, one or more reservoirs can be formed on the registration area 6 to receive liquid adhesives, which can flow from the reservoirs, primarily by a capillary force, into the adhesive channels to adhere the circuit die 20 to the registration area 6. The adhesive channels or reservoirs are not in fluid communication with the channels for flowing the conductive liquid to form electrically conductive traces. One or more fiducials can be provided on the flexible substrate to precisely align the circuit die 20 with the channels.

In some embodiments, the liquid adhesive can be provided before placing the circuit die 20 into a pocket 6. In some embodiments, the liquid adhesive can be delivered to the pocket 6 as a single drop at the center of the pocket 6 or as multiple of drops in a specific pattern depending on the size and specifics of the circuit die 20. Isolated reservoirs can also be positioned at the bottom of the circuit die 20 to catch and pin the liquid adhesive in pre-defined locations. When the circuit die 20 is placed atop the liquid adhesive, the adhesive can wet out the space between the circuit die 20 and the pocket 6, while getting pinned at the edges of the channels (e.g., the outer edges 403*e* and 405*e* of the inner channels 403 and 405 in FIG. 5) under the circuit die 20. This adhesive patterning scheme can help to attach the circuit die 20 to the pocket 6 without contaminating the contact pads on the circuit die 20.

The liquid adhesive can then be solidified to form an adhesive layer, such as an adhesive layer 612 in FIGS. 6A-D. Suitable processes that can be used to enhance the solidification of the adhesive ink 40 may include, for example, curing or evaporating by heat or radiation. In some embodiments, the liquid carrier of the liquid adhesive can be evaporated, leaving the adhesive material to form the adhesive layer. When the liquid carrier is removed, the remaining adhesive material can form an adhesive layer.

FIGS. 6A-D illustrate a process of making a flexible device, according to some embodiments. A solid circuit die 20 is attached, via the adhesive layer 612, to a registration area 6 of a flexible substrate. Channels 602 and 604 are formed on a major surface of the flexible substrate, extending to be underneath contact pads 22 on the bottom surface of the circuit die 20. In some embodiments, the channels 602 and 604 can be an inlet channel and an outlet channel, respectively. A conductive liquid 16 flows in the channels, primarily by a capillary force, wets and spreads on side surfaces of the channels and on the contact pads 22. The conductive liquid 16 is then solidified to form an electrically conductive trace 30 in the channels 22 that includes an electrical contact 30*c* in direct contact with the contact pads 22 of the circuit die 20. Solidifying the conductive liquid 16 in the channels 602 and 604 may form a void space 33' that is underneath the circuit die 20.

The first polymer liquid 40 can be provided to flow in the channel to at least partially fill the void space 33'. The first polymer liquid 40 can wet and spread on the free surface of the electrically conductive trace 30 and cover the electrical contact 30*c* formed between the trace 30 and the contact pad 22 adjacent to the edge portion 222 of the contact pad 22. The first polymer liquid 40 can then be solidified to form a polymer layer 40'.

Figure 7A:
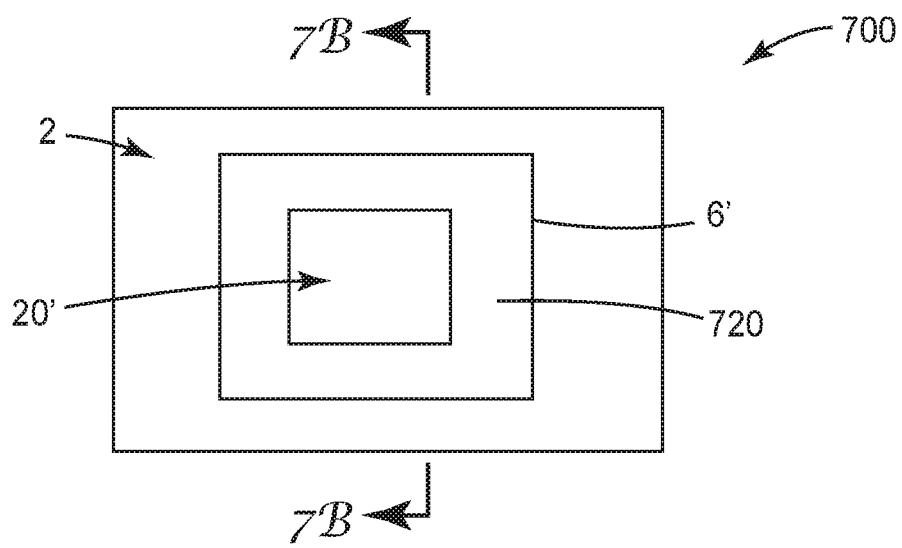
FIG. 7A is a top view of an article including a solid circuit die disposed in a pocket on a substrate where a gap therebetween is filled with a polymer liquid, according to one embodiment.
Figure 7B:
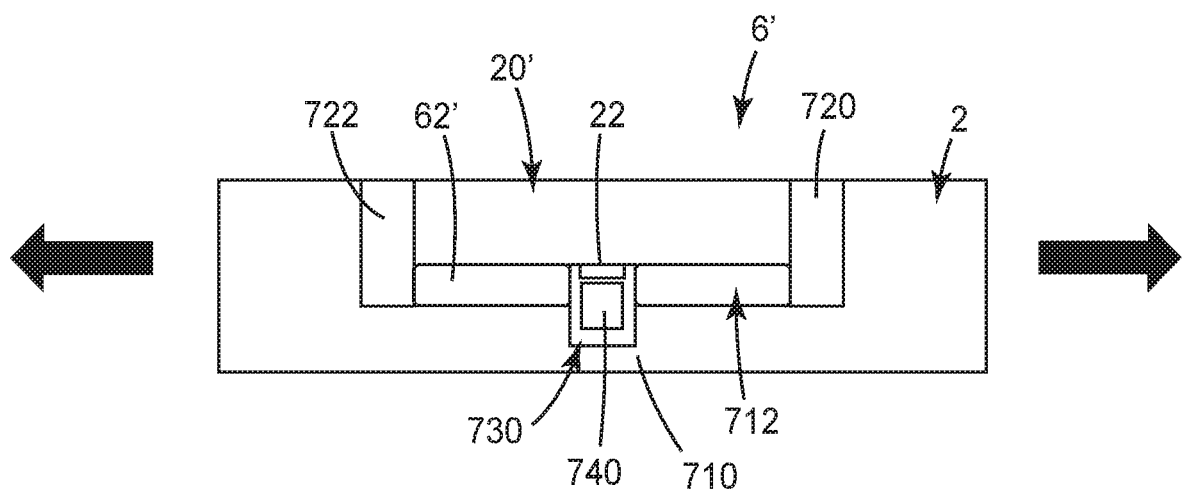
FIG. 7B is a cross sectional view of the article of FIG. 7A along the line 7B-7B, according to one embodiment.

FIG. 7A is a top portion view of an article 700 including an oversized pocket 6' on a flexible substrate to receive a solid circuit die 20', according to one embodiment. FIG. 7B is a cross-sectional view of the article 700. The pocket 6' is formed on the substrate 2, having a size larger than that of the solid circuit die 20'. The solid circuit die 20' is disposed in the pocket 6', facing down to the bottom surface 62' of the pocket 6'. The bottom contact pad 22' of the circuit die 20' can be aligned with the channel 710 extending into the pocket 6'. The channels 710 can include one or more inlet channels, outlet channels, etc. In the depicted embodiment, the solid circuit die 20' is attached to the bottom surface 62' of the pocket 6' via an adhesive layer 712 which can be formed by solidifying a liquid adhesive.

With the solid circuit die 20' being positioned in the pocket 6', an electrically conductive trace 730 can be formed in the channel 710, for example, by flowing a conductive fluid in the channel 710 and solidifying the conductive fluid. The free surface of the electrically conductive trace 730 can be covered by a product 740 by solidifying a first polymer liquid. The product 740 can at least partially fill the channel 710 and the void space underneath the bottom contact pad 22 of the circuit die 20'.

In the depicted embodiment of FIGS. 7A-B, there is a gap 720 between the side wall or edge of the solid circuit die 20' and the side wall of the pocket 6'. In some embodiments, the gap 720 may refer to the in-plane distance between the side wall of the pocket and the circuit die edge on the bottom surface 62 of the circuit die. The gap 720 can be greater than the tolerance that is required to position the circuit die into the pocket. For example, a typical tolerance may be, for example, from about 10 to about 20 micrometers, generally less than about 50 micrometers. In some embodiments, the gap 720 may be at least 3 times, at least 5 times, at least 7 times, at least 10 times, or at least 20 times greater than the required tolerance. In some embodiments, the gap 720 may be in a range, for example, from about 100 micrometers to about 2 mm or greater.

In the depicted embodiment of FIGS. 7A-B, the gap 720 is filled with a product 722 by solidifying a second fluid polymer. In some embodiments, after the formation of electrically conductive traces in the channels 710, the second polymer liquid can be provided to flow, primarily by a capillary force, in the void space of the gap 720 to at least partially fill the gap 720. In some embodiments, the second polymer liquid may include, for example, a UV curable polymer. Exemplary polymer liquid may include UV curable acrylates, heat curable epoxy, 2-part epoxy, etc. In some embodiments, the second polymer liquid may include a poly (thiol-ene) which can be made by the free radical polymerization of multifunctional thiols and multifunctional enes (vinyl terminated compounds). In one example prepared in the present application, the second polymer liquid was an optical adhesive commercially available from Norland Products, Inc. (CRANBURY, N.J., USA) under the trade designation NOA-73. The second polymer liquid can be delivered into the gap 720 by various methods including, for example, ink jet printing, dispensing, micro-injection, coating, etc.

The second polymer liquid can be solidified to form the product 722. In some embodiments, the product 722 has a higher modulus than that of the material forming the pocket 6' on the flexible substrate 2. In some embodiments, a product of curing a UV curable polymer may have a modulus in the range, for example, between 0.1 MPa to 10 GPa. The pocket material may include, for example, an acrylate, urethane, silicone, or epoxy which can have moduli in the range, for example, between 0.1 MPa to 10 GPa.

In the present disclosure, in some embodiments, a circuit die can be received in a pocket of a flexible substrate, and the circuit die can be surrounded by a polymer material that has a higher modulus than that of the material forming the pocket. Such a gradient in moduli can help the flexible devices/circuits to survive significantly larger overall device strains such as shown by the arrows shown in FIG. 7B. In contrast, for devices/circuits without such a gradient in moduli, an overall device strain may result in high local strains near the circuit die, channels, or cavities. Since the conductive traces are not as stretchable as the substrate, the local strains may cause cracking and break the device even at relatively low overall strains. The present disclosure provides a gradient in material moduli to address these issues. It is to be understood that various configurations of moduli materials and gradients of moduli can be utilized to manage device strain for enhanced stretchability, flexibility and bendability.

Figure 8A:
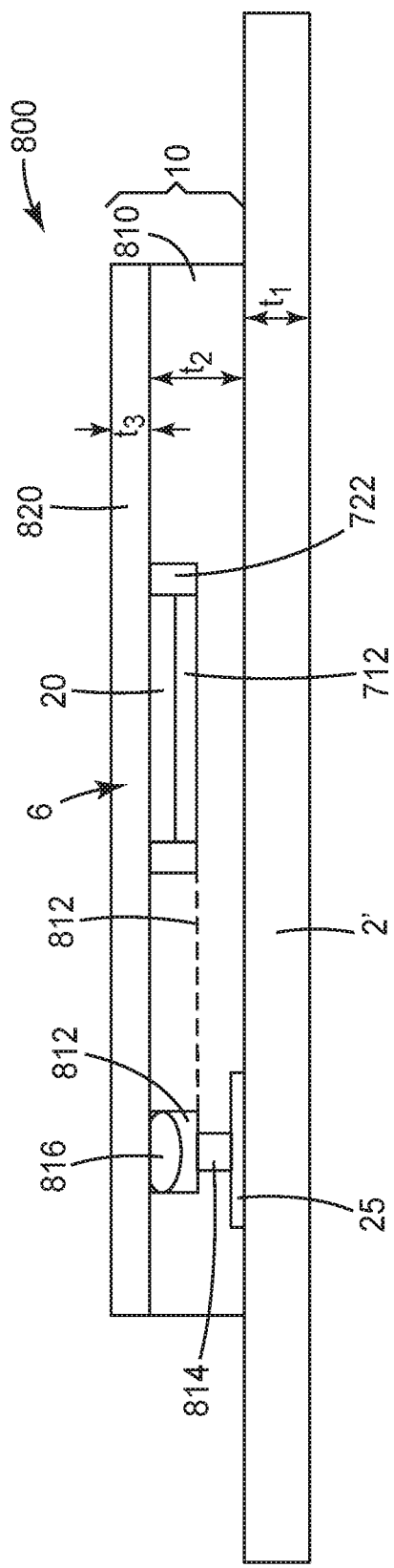
FIG. 8A is a cross-sectional view of a flexible device 800 of FIG. 8B along the line 8A-8A, according to one embodiment.
Figure 8B:
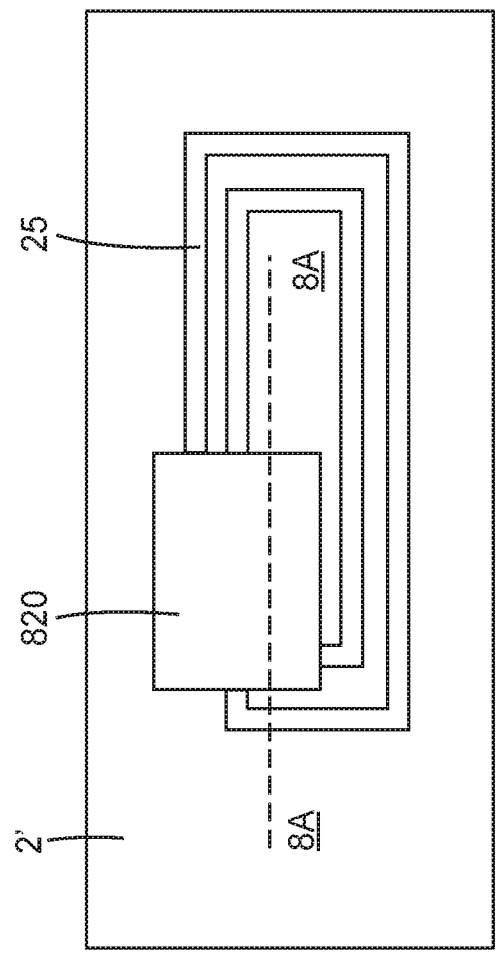
FIG. 8B is a plan view of the flexible device 800 of FIG. 8A, according to one embodiment.

FIG. 8A is a cross sectional view of a flexible device 800 including an island structure 10 on the flexible substrate 2', according to one embodiment. FIG. 8B is a plan view of the flexible device 800 of FIG. 8A. FIG. 8C is an exploded plan view of the flexible device 800 of FIG. 8A with an overcoat removed. FIG. 8D is an exploded plan view of the flexible device 800 of FIG. 8A with the overcoat and a circuit die removed. The flexible device 800 includes an island structure 10 disposed on a flexible substrate 2'.

The flexible substrate 2' may include any stretchable, flexible, elastic material such as, for example, polyurethane, rubber, epoxy, polyethylene terephthalate (PET), polyethylene, polystyrene, etc. In one example prepared in this application, a Very High Bond (VHB) tape was used as a flexible substrate, which is commercially available from 3M Company, St. Paul, Minn., under the trade designation Very High Bond (VHB) Tape 4910. It is to be understood in some embodiments, a portion of the substrate 2' may be rigid, and the substrate 2' as a whole can be flexible and stretchable. The flexible and stretchable substrate 2' may have a modulus E1 in the range, for example, between 0.1 MPa to 10 GPa.

The island structure 10 includes a channel layer 810 disposed on the flexible substrate 2'. The channel layer 810 can be made of a relatively stiff polymer material having a modulus E2 greater than the modulus E1 of the flexible substrate. The modulus E2 may be in the range, for example, between 0.1 MPa and 10 GPa, between 1 MPa and 10 GPa, or between 5 MPa and 10 GPa. The channel layer 810 can be made of a UV curable material, a thermally curable material, a reactive material, or other suitable materials as long as they have the appropriate modulus for the desired properties.

In some embodiments, suitable materials for the channel layer 810 may include, for example, an optical adhesive such as the optical adhesive commercially available from Norland Products, Inc. (CRANBURY, N.J., USA) under the trade designation NOA-73. The material for the channel layer may include a 2-part UV curable epoxy such as the epoxy commercially available from 3M Company, St. Paul, Minn., under the trade designation DP100. The material for the channel layer may include one or more of a stretchable epoxy, a UV curable polyurethane or acrylic material, etc. In some embodiments, the material for the channel layer may include a poly (thiol-ene) which can be made by the free radical polymerization of multifunctional thiols and multifunctional enes (vinyl terminated compounds).

While not wishing to be bound by theory, in some embodiments, materials for a channel layer described herein may desirably have both high modulus (e.g., greater than 100 MPa), and low brittleness (e.g., acceptable elongation properties). Such properties may be achieved using compositions including urethane (meth)acrylate polymers and high Tg monomers.

In some embodiments, the material for a channel layer may include, for example,
i) urethane (meth)acrylate polymer including a reaction product of an aliphatic polyester, polycarbonate, or polyether diol, a diisocyanate, and a hydroxy functional methacrylate, and
ii) monofunctional (meth)acrylate monomer, wherein a cured homopolymer of at least one monofunctional (meth)acrylate monomer has a Tg of at least 60° C.

In some embodiments, the urethane component is a urethane (meth)acrylate polymer. Such polymer is the reaction product of a (e.g. aliphatic) polycarbonate, polyester, or polyether diol; an (e.g. aliphatic and/or aromatic) diisocyanate, and an (e.g. aliphatic and/or aromatic) hydroxy functional (meth)acrylate. The polycarbonate diol is typically of the following formula:

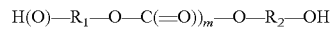

where each of $R_1$ in each $(O-R_1-O-C(=O))$ repeat unit, and $R_2$ are independently an aliphatic, cycloaliphatic, or aliphatic/cycloaliphatic alkylene group and an average number of carbon atoms in a combination of all the $R_1$ and $R_2$ groups is 4 to 10, and m is (an integer of) 2 to 23. Stated another way, while some repeat units of $R_1$ and/or $R_2$ may have a carbon number of less than 4 (e.g., 2 or 3), enough of the repeat units have a sufficiently high carbon number that when the carbon numbers of all the repeat units of $R_1$ and $R_2$ in the polycarbonate diol of Formula (I) are averaged, that average falls within the range of 4 to 10, or any of 4 to 6, 4 to 7, 4 to 8, 4 to 9, 5 to 7, 5 to 8, 5 to 9, 5 to 10, 6 to 8, 6 to 9, 6 to 10, 7 to 9, 7 to 10, or 8 to 10. In select embodiments, at least one of $R_1$ or $R_2$ is $-CH_2CH_2CH(CH_3)CH_2CH_2-$, $-(CH_2)_6-$, or $-(CH_2)_4-$, and preferably a combination of $-CH_2CH_2CH(CH_3)CH_2CH_2-$, and $-(CH_2)_6-$.

In some embodiments, either the polycarbonate diol has a number average molecular weight (Mn) of greater than 1,000 grams per mole (g/mol) or a weighted average of all polycarbonate diols present in the components has a Mn of greater than 1,000 g/mol, wherein Mn is determined by OH value. Stated a different way, when the components contain a single polycarbonate diol, the polycarbonate diol has a Mn higher than 1,000 g/mol. When the components contain two or more polycarbonate diols, the Mn of at least one of the polycarbonate diols may be 1,000 g/mol or less with the proviso that a weighted average of all the Mn values of the two or more polycarbonate diols is higher than 1,000 g/mol. For instance, components containing two polycarbonate diols could include a 1:2 molar ratio of a first polycarbonate diol having a Mn of about 500 g/mol to a second polycarbonate diol having a Mn of about 1,500 g/mol, resulting in a weighted average Mn of 1,167 g/mol. In certain embodiments, a polycarbonate diol (or a weighted average of all the polycarbonate diols present in the components) has a number average molecular weight of 1,500 g/mol or higher.

In some embodiments, the polyester diol is typically of the following formula:

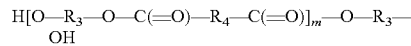

where $R_3$ and $R_4$ are independently straight or branched chain or cycle-containing alkylene, groups, that optionally include heteroatoms, such as oxygen. $R_3$ and $R_4$ independently include 2 to 40 carbon atoms. The subscript "m" is typically at least 2, 3, 4, 5, 6, or 7. The subscript "m" is typically no greater than 50, 45, 40, 35, 30, 25, 20, or 15. In some embodiments, the $R_3$ and $R_4$ are alkylene.

Representative polyester diols may include, for example, neopentyl glycol adipate diol, butane diol adipate diol;

3-methyl-1,5-pentanediol adipate diol; and 3-methyl-1,5-pentanediol sebecate diol, and dimer acid based polyols in which the dimer acid is derived for example from dimerization of two 18 carbon diacids such as linoleic acid.

In some embodiments, such as the diols just described, the polyester diol can include a single $R_3$ group (e.g. neopentyl or 3-methyl-1,5-pentyl) and a single $R_4$ group (e.g. adipate).

In other embodiments, the aliphatic polyester diol can be prepared from more than one diol and more than one acid. In this embodiment, the diol can contain two or more different $R_3$ groups and two or more different $R_4$ groups such as in the case of ethylene glycol-hexane diol/adipate-azelate copolyester diol.

In other embodiments, the polyester diol is typically of the formula as follows:

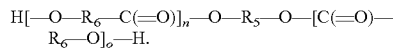

where $R_5$ and $R_6$ are independently straight or branched chain or cycle-containing alkylene groups that optionally include heteroatoms such as oxygen, the alkylene groups independently include 2 to 40 carbon atoms. The subscripts "n" and "o" (i.e. the letter o) are typically independently at least 4, 5 or 6. The subscripts "n" and "o" are typically independently no greater than 25, 20, or 15.

One representative polyester diol of this type is polycaprolactone diol, such as available from Perstorp. In this embodiment, $R_6$ is a $C_5$ alkylene group and $R_5$ is the residue of an alcohol, such as ethylene glycol, butylene glycol, diethylene glycol, and the like.

In some embodiments, at least one of $R_3$ or $R_4$ of Formula 1 and at least one of $R_5$ and $R_6$ of Formula 2 is a straight or branched chain or cycle-containing alkylene group independently including at least 4, 5, or 6 carbon atoms.

In some embodiments, each of the $R_3$ and $R_4$ groups of Formula 1 are alkylene groups independently including at least 4, 5, or 6 carbon atoms. In some embodiments, each of the $R_5$ and $R_6$ groups of Formula 2 are alkylene groups independently including at least 4, 5, or 6 carbon atoms.

The values of m, n, and o are chosen such that the molecular weight (Mn) of the diol is at least 500, 600, 700, 800, 900, or 1000 g/mole. In some embodiments, the molecular weight (Mn) of the diol is at least 1100, 1200, 1300, 1400, 1500 g/mole. In some embodiments, the molecular weight (Mn) of the diol is at least 1600, 1700, 1800, 1900, or 2000 g/mole. In some embodiments, the molecular weight (Mn) of the diol is no greater than 10,000; 9,000; 8,000; 7,000; 6,000; 5000; 4000; or 3000 g/mole. When the molecular weight is too low the elongation can be insufficient (i.e. less than 15-20%). The values of m, n, and o can vary widely due to the range of carbons for the $R_3$, $R_4$, $R_5$ and $R_6$ groups.

The polyether diol is typically of the following formula:
H[—O—$R_7$]$_q$—OH, wherein each of $R_7$ in each [—O—$R_7$] repeat unit, is independently an aliphatic, cycloaliphatic, or aliphatic/cycloaliphatic alkylene group of 2 to 10 carbon atoms. In some embodiments the polyether polyol includes units of poly(ethyleneoxide), poly(propyleneoxide), or a poly(tetramethylene oxide). Among these types, the poly(tetramethylene oxide) diol is preferred.

Preferably no more than 20% of the q groups have 2 or 3 carbons. The values q are chosen such that the molecular weight (Mn) of the diol is at least 500, 600, 700, 800, 900, or 1000 g/mole. In some embodiments, the molecular weight (Mn) of the diol is at least 1100, 1200, 1300, 1400, 1500 g/mole. In some embodiments, the molecular weight (Mn) of the diol is at least 1600, 1700, 1800, 1900, or 2000 g/mole. In some embodiments, the molecular weight (Mn) of the diol is no greater than 10,000; 9,000; 8,000; 7,000; 6,000; 5000; 4000; or 3000 g/mole. When the molecular weight is too low the elongation can be insufficient (i.e. less than 15-20%).

In some embodiments, the urethane (meth)acrylate polymers are of the formula

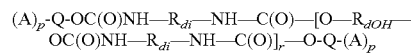

where, A has the formula —OC(=O)C($R_1$)=CH$_2$ wherein $R_1$ is H or alkyl of 1 to 4 carbon atoms (e.g. methyl), p is 1 or 2, Q is a polyvalent organic linking group, $R_{di}$ is the residue of a diisocyanate, $R_{dOH}$ is the residue of a polyester, polycarbonate, or polyether polyol, and r averages 1 to 15.

Such urethane (meth)acrylate polymers represented by the following formula

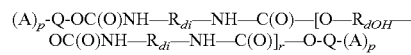

where, A has the formula —OC(=O)C($R_1$)=CH$_2$ wherein $R_1$ is H or alkyl of 1 to 4 carbon atoms (e.g. methyl), p is 1 or 2, Q is a polyvalent organic linking group as described below, $R_{di}$ is the residue of a diisocyanate, $R_{dOH}$ is the residue of a polyester, polycarbonate polyol, or polyether and r averages 1 to 15. In some embodiments, r averages at least 2, 3, 4, or 5. In some embodiments, A is a methacryl functional group, such as methacrylate. Various diisocyanates can be used in the preparation of the urethane (meth)acrylate polymer. In typical embodiments, useful diisocyanates can be characterized by the formula $R_{di}(NCO)_2$, wherein $R_{di}$ is the aliphatic and/or aromatic moiety between the isocyanate groups. Once reacted, $R_{di}$ is also commonly referred to as the residue of the diisocyanate. Various polyols can be used in the preparation of the urethane (meth)acrylate polymer. In typical embodiments, useful polymeric polyols can be characterized by the formula $R_{dOH}$(OH)$_2$, wherein $R_{dOH}$ is the what remains after the hydroxyl groups are removed from the polymeric polyol. In some embodiments, $R_{dOH}$ is the residue of a polyol, including, for example, a polyester, polycarbonate, or polyether diol.

In some embodiments, Q is a straight or branched chain or cycle-containing aliphatic (e.g. divalent) connecting group, such an alkylene. In other embodiments, Q is an aromatic (e.g. divalent) connecting group, such as arylene, aralkylene, and alkarylene. Q can optionally include heteroatoms such as O, N, and S, and combinations thereof. Q can also optionally include a heteroatom-containing functional group such as carbonyl or sulfonyl, and combinations thereof. Q typically includes no greater than 20 carbon atoms.

In some embodiments, Q is typically alkylene including no greater than 12, 10, 8 or 6 carbon atoms. In some embodiments, Q is a $C_2$, $C_3$, or $C_4$ alkylene group. In some embodiments, p is 1.

The urethane (meth)acrylate polymer (e.g. including polymerized units of an aliphatic polycarbonate or polyester diol) described herein is the primary difunctional (e.g. di(meth)acrylate) component of the free-radically polymerizable resin composition. The total amount of urethane (meth)acrylate polymer is typically at least 25, 30, 35, or 40 wt. % based on the total weight of the free-radically polymerizable resin (e.g. excluding inorganic components, such as filler.) The total amount of urethane (meth)acrylate polymer is typically no greater than 70, 65, or 60 wt. %.

Oligomers that are the reaction product of hydroxy functional (meth)acrylate and diisocyanate (at the exclusion of polycarbonate or polyester diol) have been found to be a by-product of the polymerization reaction of components in certain embodiments. It is possible to purify the polyurethane methacrylate polymer to remove such by-products. Alternatively, additional by-products such as oligomers may be added to the polymerized reaction product, particularly when a specific reaction generates a small amount of one or more by-products. It has been discovered that some side product components can improve at least one of modulus or extent of crosslinking after the photopolymerizable composition has been cured.

For example, photopolymerizable compositions optionally include a compound of the formula:

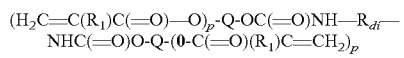
NHC(=O)O-Q-(0-C(=O)(R$_1$)C=CH$_2$)$_p$ where Q, p, and R$_1$ are the same as described above, and R$_{di}$ is the residue of a diisocyanate as defined above. Typically, the compound is produced during the polymerization of the components, as described above. In certain embodiments, the compound is added to the photopolymerizable composition, particularly when a smaller amount of such compound is produced by the polymerization of components than desired. In any embodiment, the compound may advantageously improve crosslinking during the photopolymerization reaction, increase the modulus or the photopolymerization reaction product, or both. Regardless of whether the compound is formed during the polymerization of the components, added separately to the photopolymerizable composition, or both, in some embodiments the compound is present in an amount of 0.05 weight percent (wt. %) or greater, based on the weight of the polymerizable composition, 0.1 wt. % or greater, 0.5 wt. % or greater, 1 wt. % or greater, 1.5 wt. % or greater, 2 wt. % or greater, 3 wt. % or greater, 4 wt. % or greater, 5 wt. % or greater, 6 wt. % or greater, 7 wt. % or greater, 8 wt. % or greater, or 9 wt. % or greater; and 20 wt. % or less, 18 wt. % or less, 16 wt. % or less, 14 wt. % or less, 12 wt. % or less, or 10 wt. % or less, based on the weight of the polymerizable composition. Stated another way, the compound of may be present in the photopolymerizable composition in an amount of 0.05 to 20 weight percent (wt. %), 1.5 to 12 wt. %, 2.5% to 12% wt. %, 5% to 15% wt. %, 5% to 12% wt. %, 7% to 15% wt. %, 7% to 12% wt. %, or 5 to 20 wt. %, based on the weight of the polymerizable resin composition.

In select embodiments, the compound is:

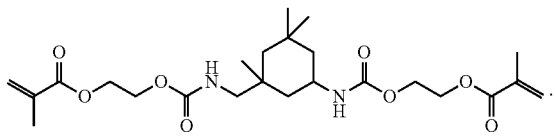 [SMILES: C=C(C)C(=O)OCCOC(=O)NCC1(C)CC(NC(=O)OCCOC(=O)C(=C)C)CC(C)(C)C1]

In another embodied synthetic route, the urethane (meth) acrylate polymer is a reaction product of an (e.g. aliphatic) polycarbonate or polyester diol, as described above, and an (e.g. aliphatic and/or aromatic) isocyanate functional (meth) acrylate, typically in the presence of a catalyst.

In typical embodiments, the isocyanate functional (meth) acrylate has the formula as follows:

(A)$_p$-Q-NCO where A and Q are the same as described above.

Examples of the isocyanate functional (meth)acrylates include isocyanatoethyl methacrylate, isocyanatoethoxyethyl methacrylate, isocyanatoethyl acrylate, and 1,1-(bisacryloyloxymethyl) ethyl isocyanate, which are for instance commercially available from Showa Denko (Tokyo, Japan).

Such urethane (meth)acrylate polymers can be represented by the following formula:

(A)$_p$-Q-NHC(O)O—R$_{dOH}$—OC(O)NH-Q-(A)$_p$ where A, p, Q and R$_{dOH}$ are the same as described above. In some embodiments, A is a methacrylate functional group. This material may be used as the primary difunctional (e.g. di(meth)acrylate) component of the free-radically polymerizable resin composition, or as an additional component.

In some embodiments, the photopolymerizable composition includes one or more "high Tg" monofunctional (meth) acrylate monomers, i.e. wherein a cured homopolymer of such monofunctional (meth)acrylate monomer has a Tg of at least 60, 65, 70, 75, 80, 85 or 90° C. In some embodiments, the polymerizable composition includes at least one of monofunctional (meth)acrylate monomer wherein a cured homopolymer of such monofunctional (meth)acrylate monomer has a Tg of at least 95, 100, 105, 110, 115, 120, 125, 130, 135, 140, 145, 150, 155, 160, 165, 170, 175, 180, 185 or 190° C. The Tg of the homopolymer of the monofunctional (meth)acrylate monomer is typically no greater than about 260° C. For example, 1-adamantyl methacrylate decomposes at about 260° C. In some embodiment, the Tg of the homopolymer of the monofunctional (meth)acrylate monomer is no greater than 255, 250, 245, 240, 235, 230, 225, 220, 215, 210, 205 or 200° C.

In some embodiments, the high Tg monofunctional (meth)acrylate monomer comprises a cyclic moiety. Although the cyclic moiety may be aromatic, in typical embodiments, the cyclic moiety is a cycloaliphatic. Suitable monofunctional (meth)acrylate monomers include for instance and without limitation, 3,3,5-trimethylcyclohexyl (meth)acrylate, butyl-cyclohexyl(meth)acrylate, 2-decahydronapthyl (meth)acrylate, 1-adamantyl (meth)acrylate, 1-adamantyl acrylate, dicyclopentadienyl (meth)acrylate, dicyclopentadienyl acrylate, bornyl (meth)acrylate, bornyl acrylate, isobornyl (meth)acrylate, isobornyl acrylate, dimethyl-1-adamantyl (meth)acrylate, dimethyl-1-adamantyl acrylate, 3-tetracyclo[4.4.0.1.1]dodecyl methacrylate, and 3-tetracyclo[4.4.0.1.1]dodecyl acrylate.

The high Tg monofunctional (meth)acrylate monomer is typically at least 25, 30, 35, or 40 wt. % based on the total weight of the free-radically polymerizable resin (e.g. excluding inorganic components, such as filler.) The total amount of the high Tg monofunctional (meth)acrylate monomer is typically no greater than 75, 70, 65, or 60 wt. %.

The polymerizable compositions may optionally include other difunctional (meth)acrylate monomer(s) or polymer(s). Suitable free-radically polymerizable multifunctional reactant diluents include di-, tri-, or other poly-acrylates and methacrylates. The other difunctional (meth) acrylate monomer(s) or polymer(s) may include the previously described by-product as well as reaction products of diisocyanates and hydroxy functional (meth)acrylates.

In some embodiments, the channel layer 810 may have a multilayer structure. For example, the channel layer 810 may include a stiff polymer layer laminated with a relatively softer polymer layer which can bond the stiff polymer layer onto the flexible substrate. The stiff polymer layer may include, for example, PET. The relatively softer polymer layer may include, for example, an adhesive. It is to be understood that the multilayer structure may include any suitable materials for a channel layer described herein.

The channel layer 810 includes one or more surface channels 812 formed on an exposed surface 811 thereof and one or more via channels 814 fluidly connected to at least one of the surface channels 812. See FIGS. 8A and 8C-D. At least one of the via channels 814 extends vertically through the channel layer 810 to access an electrically conductive material 25 on the flexible substrate 2'. The electrically conductive material 25 may be a portion of a circuitry (e.g., an antenna circuitry) formed on the flexible substrate 2'. The surface channels 812 and the via channels 814 can be formed by any suitable mechanical, chemical, or optical techniques including, for example, microreplication, hot embossing, molding, soft lithography, etching, 3D printing, laser drilling, etc.

In some embodiments, the channel layer 810 can be a microreplicated structure formed by a microreplication process. The liquid from which the microreplicated structures are created can be a curable photocurable material, such as acrylates curable by UV light. One of ordinary skill in the art will appreciate that other coating materials can be used, for example, polymerizable material, and selection of a material will depend on the particular characteristics desired for the microreplicated structures. For example, if a flexible circuit board is being made, the coating material may include a conductive or insulating polymer. In some embodiments, the coating material includes an electroplate masking material and/or nonconductive or insulating polymers.

Electrically conductive traces 830 are formed in the surface channels 812 and the via channels 814 to electrically contact with the electrically conductive material 25 on the flexible substrate 2' underneath the island structure 10. The electrically conductive traces 830 can be formed by any suitable processes described herein. For example, the electrically conductive traces 830 can be formed by flowing the conductive liquid 16 of FIG. 3A in the surface channels 812. The conductive liquid 16 can also flow into the via channels 814 and make a contact to the electrically conductive material 25. The conductive liquid 16 can then be solidified to form the electrically conductive traces 830.

The electrically conductive traces 830 in the surface channels 812 have the respective free surfaces 832 which can be covered to protect the electrically conductive traces 830 and the corresponding contacts formed thereof, as described further above. In some embodiments, the electrically conductive traces 830 can be reinforced by backfilling the channels with a product 816 of solidifying a polymer liquid. The polymer liquid can flow in the channels along the free surfaces 832 to form a protective cover layer thereon after solidification. The polymer liquid can be the same as the first polymer liquid 40 of FIGS. 4C-4E or the same material of the channel layer 810. In some embodiments, the product 816 may have a modulus E4 that is greater that the modulus E2 of the channel layer 810.

A stiffness ratio between the substrate 2' and the channel layer 810 is defined as following: $(E2*t2)/(E1*t1)$, where E1 and E2 are the respective elasticity moduli of the substrate 2' and the channel layer 810, and t1 and t2 are the respective thicknesses as shown in FIG. 8A. It was found in this disclosure that higher stiffness ratios result in lower maximum tensile strains experienced by the channel layer or the conductive traces in the channels; the stiffer and thicker the channel layer 810 is compared to the substrate 2', the more stretchable and robust the structure becomes. In practice, the conductive traces 830 in the channel 812 tend to break at relatively low strains (1-3%). A safety window W for the maximum tensile strain experienced by the conductive traces (e.g., about 3% or lower) may depend on the overall in-plane strain applied on the substrate 2'. For example, a preferred stiffness ratio may be at least 5 or higher to accommodate up to 5% overall strain applied to the substrate; a preferred stiffness ratio may be at least 5 or higher, at least 7 or higher, or at least 9 or higher, to accommodate up to 20% overall strain applied to the substrate; and a preferred stiffness ratio may be at least 15 or higher to accommodate up to 50% overall strain applied to the substrate. For an overall in-plane strain is between about 5% and about 50%, a required lower limit of the ratio of $(E2*t2)/(E1*t1)$ is between about 5 and about 15, respectively. This will be explained referring to FIG. 9B further below.

In some embodiments, one or more optional circuit dies can be provided to the island structure 10. The electrically conductive traces 830 can electrically contact to the corresponding contact pads of the circuit dies in various manners as described herein. In the depicted embodiment of FIG. 8A, the island structure 10 further includes a pocket 6 to receive a solid circuit die 20. The solid circuit die 20 is attached to the bottom surface of the pocket 6 via an adhesive layer 712 which can be formed by solidifying a liquid adhesive. As shown in FIG. 8D, a conductive liquid (the conductive liquid 16 of FIG. 6B) can flow into a channel 812U underneath the circuit die to contact with the corresponding contact pads on the circuit die. The electrically conductive traces can be reinforced by backfilling the void space with the product 816 of solidifying a polymer liquid in a manner similar as shown in FIGS. 6A-D. A product 722 of solidifying a fluid polymer can be used to fill the gap between the solid circuit die 20 and the pocket 6 after the formation of electrical contacts between the electrically conductive traces 830 and the corresponding contact pads of the circuit dies.

In the depicted embodiment of FIGS. 8A-B, an overcoat 820 is provided to cover the channel layer 810. In some embodiments, the overcoat 820 has a thickness t3 and may be made of one or more barrier materials to prevent penetration by water or other ambient factors from the underneath electrically conductive traces or circuit dies. In some embodiments, the overcoat 820 may be made of a material having a modulus E3 that might be greater than the modulus E1 of the flexible substrate 2' and lower than the modulus E2 of the channel layer 810. It is to be understood that the overcoat 820 can be made of any suitable protective materials such as, for example, a barrier having an adhesive surface to attach to the channel layer 810.

The operation of the present disclosure will be further described with regard to the following embodiments. These embodiments are offered to further illustrate the various specific and preferred embodiments and techniques. It should be understood, however, that many variations and modifications may be made while remaining within the scope of the present disclosure.

Listing of Exemplary Embodiments

It is to be understood that any one of embodiments 1-13, 14-20, 21-26 and 27-35 can be combined.

Embodiment 1 is a method of making a flexible device, the method comprising:

providing a flexible substrate including a registration area and one or more channels on a major surface thereof, the channels extending into the registration area;

providing a solid circuit die on the registration area, the solid circuit die having one or more contact pads on a surface thereof;

forming one or more electrically conductive traces in the channels to electrically contact with the contact pads of the solid circuit die; and flowing a first polymer liquid in the channels to cover a free surface of the electrically conductive traces.

Embodiment 2 is the method of embodiment 1, wherein flowing the first curable polymer further comprises filling a cavity in the channels underneath the solid circuit die with the first polymer liquid, primarily by a capillary force.

Embodiment 3 is the method of embodiment 1 or 2, wherein the first polymer liquid comprises a UV curable polymer.

Embodiment 4 is the method of any one of embodiments 1-3, further comprising solidifying the first polymer liquid.

Embodiment 5 is the method of embodiment 4, wherein a product of solidifying the first polymer liquid has a higher modulus than that of the flexible substrate.

Embodiment 6 is the method of any one of embodiments 1-5, wherein the registration area includes a pocket to receive the solid circuit die, and the pocket is oversized such that there is a gap between edges of the pocket and the solid circuit die.

Embodiment 7 is the method of embodiment 6, further comprising flowing a second polymer liquid in the gap to at least partially fill the gap.

Embodiment 8 is the method of embodiment 7, further comprising solidifying the second polymer liquid, wherein a product of solidifying the second polymer liquid has a higher modulus than that of the flexible substrate.

Embodiment 9 is the method of embodiment 5, wherein the second polymer liquid comprises a UV curable polymer.

Embodiment 10 is the method of any one of embodiments 1-9, wherein forming the one or more electrically conductive traces comprises disposing a conductive liquid into the channels and flowing the conductive liquid, primarily by a capillary force, in the channels.

Embodiment 11 is the method of embodiment 10, further comprising comprises solidifying the conductive liquid.

Embodiment 12 is the method of any one of embodiments 1-11, wherein the channels comprise an inlet channel and an outlet channel that are fluidly connected, and the first polymer liquid flows into the inlet channel.

Embodiment 13 is the method of any one of embodiments 1-12, wherein providing the solid circuit die on a registration area comprises attaching the solid circuit die on the registration area by an adhesive.

Embodiment 14 is a flexible device comprising:

a flexible substrate including a registration area and one or more channels on a major surface thereof, the channels extending into the registration area;

a solid circuit die disposed on the registration area, the solid circuit die having one or more contact pads on a surface thereof;

one or more electrically conductive traces formed in the channels, the traces forming one or more electrical contacts with the contact pads of the solid circuit die; and a product of solidifying a first polymer liquid that covers a free surface of the electrically conductive traces, wherein the product has a higher modulus than that of the flexible substrate.

Embodiment 15 is the device of embodiment 14, wherein the product of solidifying the first polymer liquid at least partially fills a cavity in the channels underneath the solid circuit die.

Embodiment 16 is the device of embodiment 14 or 15, wherein the product comprises a product of curing a UV curable polymer.

Embodiment 17 is the device of any one of embodiments 14-16, wherein the registration area includes a pocket to receive the solid circuit die, and a product of solidifying a second polymer fluid at least partially fills the gap.

Embodiment 18 is the device of embodiment 17, wherein the product comprises a curing product of a UV curable polymer, and the product has a higher modulus than that of the flexible substrate.

Embodiment 19 is the device of any one of embodiments 14-18, wherein the channels comprise an inlet channel and an outlet channel that are fluidly connected, and the product of solidifying the first polymer liquid extends from the inlet channel into the outlet channel.

Embodiment 20 is the device of any one of embodiments 14-19, wherein the solid circuit die is attached on the registration area by an adhesive.

Embodiment 21 is a method of making a flexible device, the method comprising:

providing a flexible substrate having a circuitry thereon;

providing an island structure on the flexible substrate to at least partially cover the circuitry thereon, the island structure including one or more surface channels on an exposed surface thereof, and one or more via channels fluidly connected to at least one of the surface channels and extending vertically through the island structure;

forming one or more electrically conductive traces in the surface channels and the via channels to electrically contact with the circuitry on the flexible substrate underneath the island structure; and providing a first polymer liquid in the surface channels to cover a free surface of the electrically conductive traces therein.

Embodiment 22 is the method of embodiment 21, wherein the island structure having a modulus E2 greater than the modulus E1 of the flexible substrate.

Embodiment 23 is the method of embodiment 21 or 22, further comprising providing an overcoat to cover the island structure.

Embodiment 24 is the method of any one of embodiments 21-23, further comprising flowing first polymer liquid in the surface channels and the via channels and solidifying the first polymer liquid.

Embodiment 25 is the method of any one of embodiments 21-24, further comprising providing a solid circuit die to the island structure, flowing a second polymer liquid to at least partially surrounding the solid circuit die, and solidifying the second polymer liquid.

Embodiment 26 is the method of any one of embodiments 21-25, wherein forming the one or more electrically conductive traces comprises disposing a conductive liquid into the channels and flowing the conductive liquid, primarily by a capillary force, in the channels, and solidifying the conductive liquid.

Embodiment 27 is a flexible device comprising:

a flexible substrate having a circuitry thereon;

an island structure on the flexible substrate to at least partially cover the circuitry thereon, the island structure including one or more surface channels on an exposed surface thereof, one or more via channels fluidly connected to at least one of the surface channels;

one or more electrically conductive traces formed in the surface channels and the via channels to electrically contact with the circuitry on the flexible substrate underneath the island structure; and a product of solidifying a first polymer liquid that covers a free surface of the electrically conductive traces.

Embodiment 28 is the device of embodiment 27, wherein the flexible substrate having a modulus E1, and a thickness t1, the island structure having a modulus E2 and a thickness t2, and the ratio of (E2×t2)/(E1×t1) is greater than 7.

Embodiment 29 is the device of embodiment 27 or 28, wherein the flexible substrate having a modulus E1, and a thickness t1, the island structure having a modulus E2 and a thickness t2, and when an overall in-plane strain applied onto the flexible substrate is between about 5% and about 50%, a required lower limit of the ratio of (E2×t2)/(E1×t1) is between about 5 and about 15, respectively.

Embodiment 30 is the device of any one of embodiments 27-29, further comprising an overcoat to cover the island structure.

Embodiment 31 is the device of any one of embodiments 27-30, wherein the product has a modulus E4 that is greater that the modulus E2 of the island structure.

Embodiment 32 is the device of any one of embodiments 27-31, wherein the first polymer liquid includes a UV curable polymer.

Embodiment 33 is the device of any one of embodiments 27-32, wherein the island structure further includes a pocket to receive a solid circuit die, and a product of solidifying a second polymer fluid at least partially surrounding a periphery of the solid circuit die.

Embodiment 34 is the device of any one of embodiments 27-33, wherein the island structure has a composition comprising:

i) a urethane (meth)acrylate polymer comprising a reaction product of an aliphatic polyester, polycarbonate, or polyether diol, a diisocyanate, and a hydroxy functional methacrylate, and ii) a monofunctional (meth)acrylate monomer, wherein a cured homopolymer of at least one monofunctional (meth)acrylate monomer has a Tg of at least 60° C.

Embodiment 35 is the device of embodiment 34, wherein the urethane (meth)acrylate polymer has a formula of $(A)_p$-Q-OC(O)NH—$R_{di}$—NH—C(O)[O—$R_{dOH}$—OC(O)NH—$R_{di}$—NH—C(O)]$_r$—O-Q-$(A)_p$, wherein A has the formula —OC(=O)C($R_1$)=$CH_2$ wherein $R_1$ is H or alkyl of 1 to 4 carbon atoms (e.g. methyl), p is 1 or 2, Q is a polyvalent organic linking group, $R_{di}$ is the residue of a diisocyanate, $R_{dOH}$ is the residue of a polyester, polycarbonate, or polyether polyol, and r averages 1 to 15.

Examples of Island Structure

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Summary of Materials

Unless otherwise noted, all parts, percentages, ratios, etc. in the Examples and the rest of the specification are by weight. Solvents and other reagents used may be obtained from Sigma-Aldrich Chemical Company (Milwaukee, Wis.) unless otherwise noted. In addition, Table 1 provides abbreviations and a source for all materials used in the Examples below:

TABLE 1

| Abbreviation | Description | Source |
|---|---|---|
| NOA | a 1-part UV curable structural adhesive that is 100% solids. Once cured, it has an elasticity modulus of about 11 MPa. | Norland Products, Inc., CRANBURY, NJ, USA, under the trade designation NOA-73 |
| DP100 | a curable, 2-part rigid epoxy adhesive that sets and cures at room temperature. Once cured, it has an elasticity modulus of about 1,000 MPa | 3M Company, St. Paul, MN, under the trade designation Scotch-Weld DP 100 Clear |
| VHB | a strong, stretchable, clear adhesive made from acrylic foam. It has an elasticity modulus of about 1.8 MPa. | 3M Company, St. Paul, MN, under the trade designation Very High Bond (VHB) Tape 4910 |
| Ink | a silver nanoparticle ink that becomes conductive after solidification. | Novacentrix Corp., Austin, TX under the trade designation PSPI-1000 Conductive Spray Ink. |

Test Methods

The following test methods have been used in evaluating some of the Examples of the present disclosure.

Simulation Methods

Figure 9A:
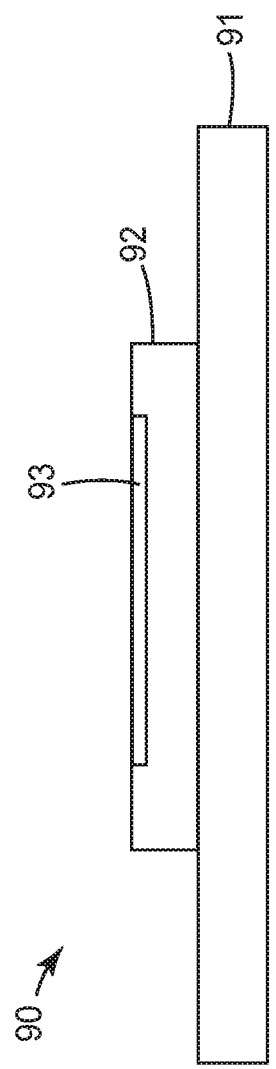
FIG. 9A is a schematic diagram of an island structure for simulation, according to one embodiment.

A commercial finite element analysis software, ANSYS Mechanical APDL 17.1 (Ansys Inc., Pittsburgh Pa., USA) was used to simulate deformation of an island structure having a configuration as shown in FIG. 9A. The modeling results were then analyzed in Design of Experiment (DOE) method by the means of DOE analysis software, ISight 5.8 (Dassault Systemes Simulia Corp., Providence R.I., USA).

A mathematical model utilized symmetry considerations and plane strain elements (typically at least 5 elements through the thickness, finer mesh near interfaces) to simulate the island structure of FIG. 9A having fixed length (51 mm for a substrate 91 and 25.4 mm for an island 92). The model calculated tensile principal strains in the surface channels 93 under applied displacements at the model ends which amounted to 20%, 30%, 40% and 50% of applied strain. The parameterized model then was used to automatically generate Full Factorial DOE around input parameters: elasticity modulus and thickness of the substrate 91 (elasticity modulus E1 in the range of about 0.5 to about 1.8 MPa; thickness t1 in the range of about 0.25 to about 1 mm), and elasticity modulus and thickness of the island 92 (elasticity modulus E2 in the range of about 10 to about 1300 MPa; thickness t2 in the range of about 0.127 to about 0.381 mm), and length of the channel 93 in the range of about 12 to about 20 mm.

Simulation Results

Figure 9B:
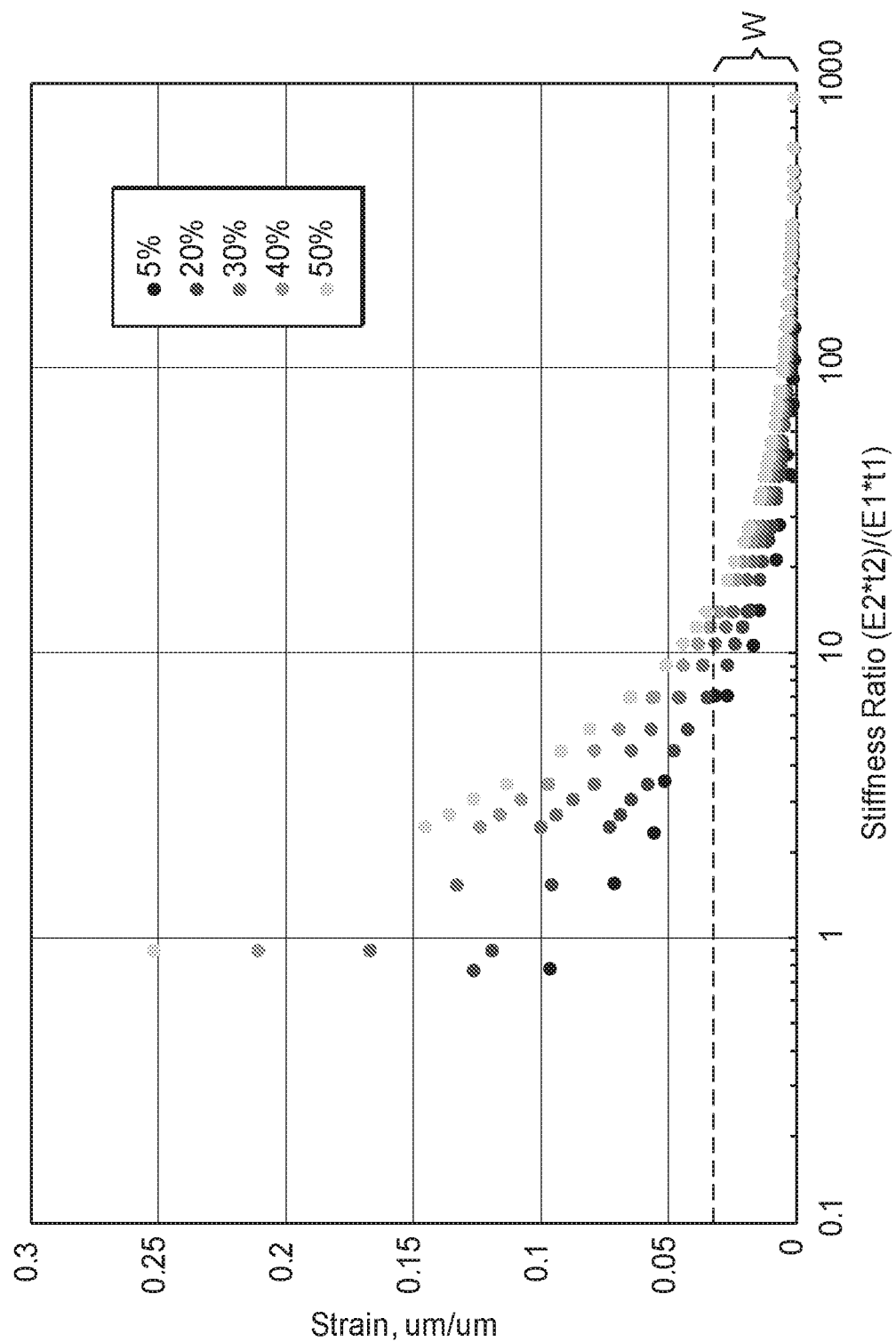
FIG. 9B is a plot of maximum tensile strain experienced by ink in channel versus stiffness ratio, according to one simulation result.

FIG. 9B is a plot of maximum tensile strain experienced by ink in the channel 93 versus a stiffness ratio, according to some simulation results. The stiffness ratio is defined as following: $(E2*t2)/(E1*t1)$, where E1 and E2 are the respective elasticity moduli of the substrate 91 and the island 92, and t1 and t2 are the respective thicknesses of the substrate 91 and the island 92. The plot of FIG. 9B examines the maximum strain versus stiffness ratio for an overall in-plane strain between 5% and 50% applied on the substrate 91, as indicated in FIG. 9B. The simulation shows that higher stiffness ratios result in lower maximum strains; the stiffer and thicker the island 93 is compared to the substrate 91, the more stretchable and robust the structure becomes. For example, since the ink in the channel 93 and interfaces in the structure tend to break at relatively low strains (1-3%), a preferred stiffness ratio may be at least 20 or higher to accommodate up to 50% applied overall strain. A safety window W for the maximum tensile strain experienced by ink (e.g., about 3% or lower) may depend on the overall in-plane strain applied on the substrate 91. When the overall in-plane strain is about 20%, the ratio of $(E2*t2)/(E1*t1)$ is greater than about 7. For an overall in-plane strain is between about 5% and about 50%, a lower limit of the ratio of $(E2*t2)/(E1*t1)$ is between about 5 and about 15, respectively.

Since the stiffness ratio depends on the product of the modulus and thickness of layers, the plot of FIG. 9B can also be used to minimize overall device thickness by specifying how high the island modulus can be to survive when both the substrate and island are as thin as possible for a low-profile device. For example, when both the substrate 91 and island 92 are about 100 micrometers in thickness, the island material can have a modulus at least 20 times greater than that of the substrate to create a robust stretchable device that can survive 50% overall applied strain.

Samples-I

Samples having a two-layer island structure as shown in FIG. 9A were prepared to demonstrate improved stretchability. Islands of NOA and DP100 were replicated on VHB substrates of different thicknesses to various island structures. Microchannels in the island structures were filled with conductive ink and the resistance change (R/R0) across the channel was measured while the VHB substrate was being strained.

Figure 10A:
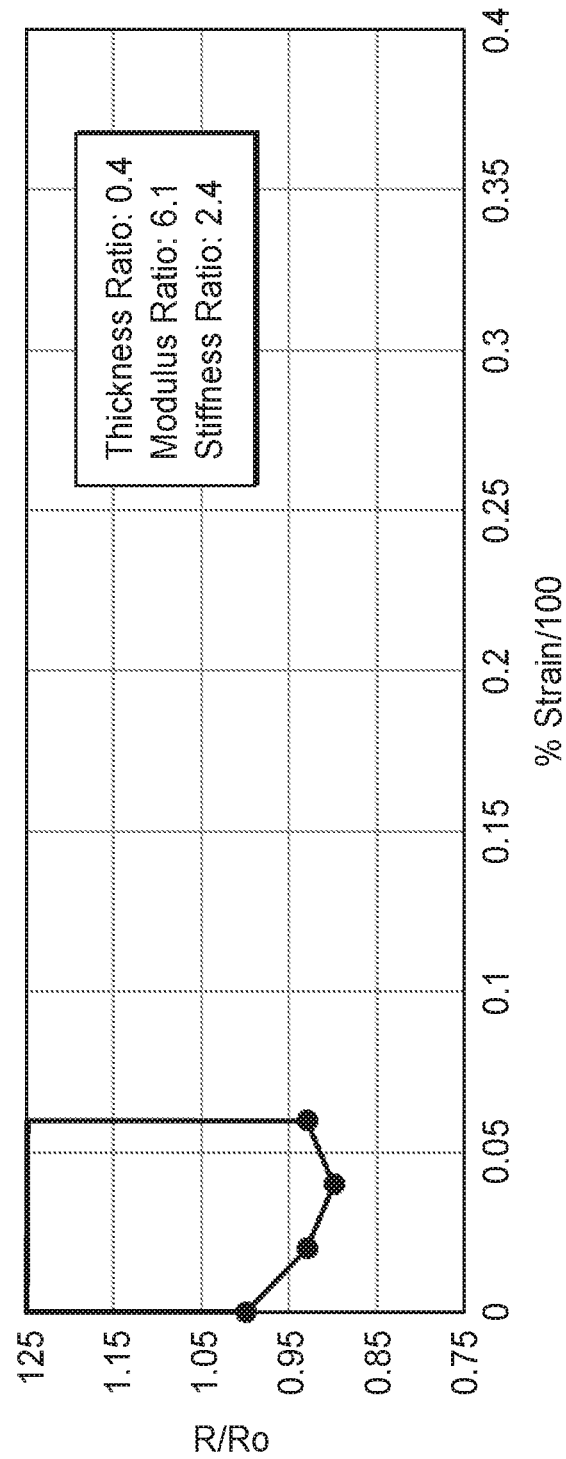
FIG. 10A is a plot of R/R0 versus strain for a lower modulus island structure on a thick substrate.
Figure 10B:
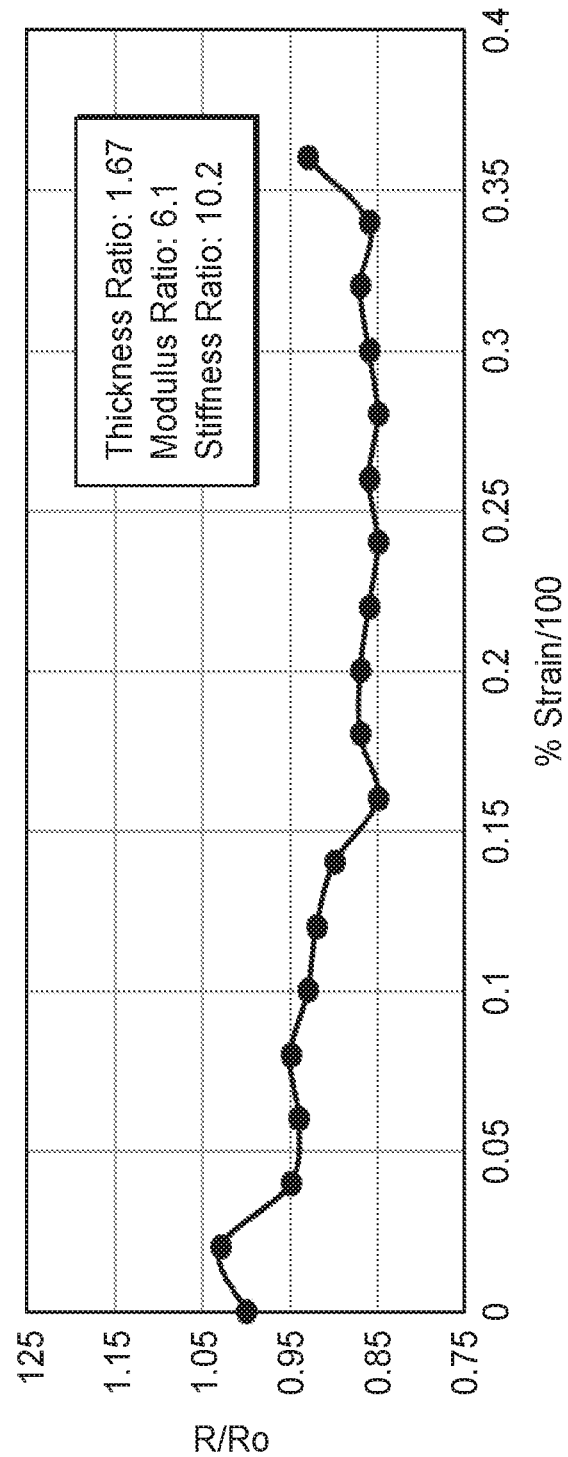
FIG. 10B is a plot of R/R0 versus strain for a lower modulus island structure on a thin substrate.
Figure 10C:
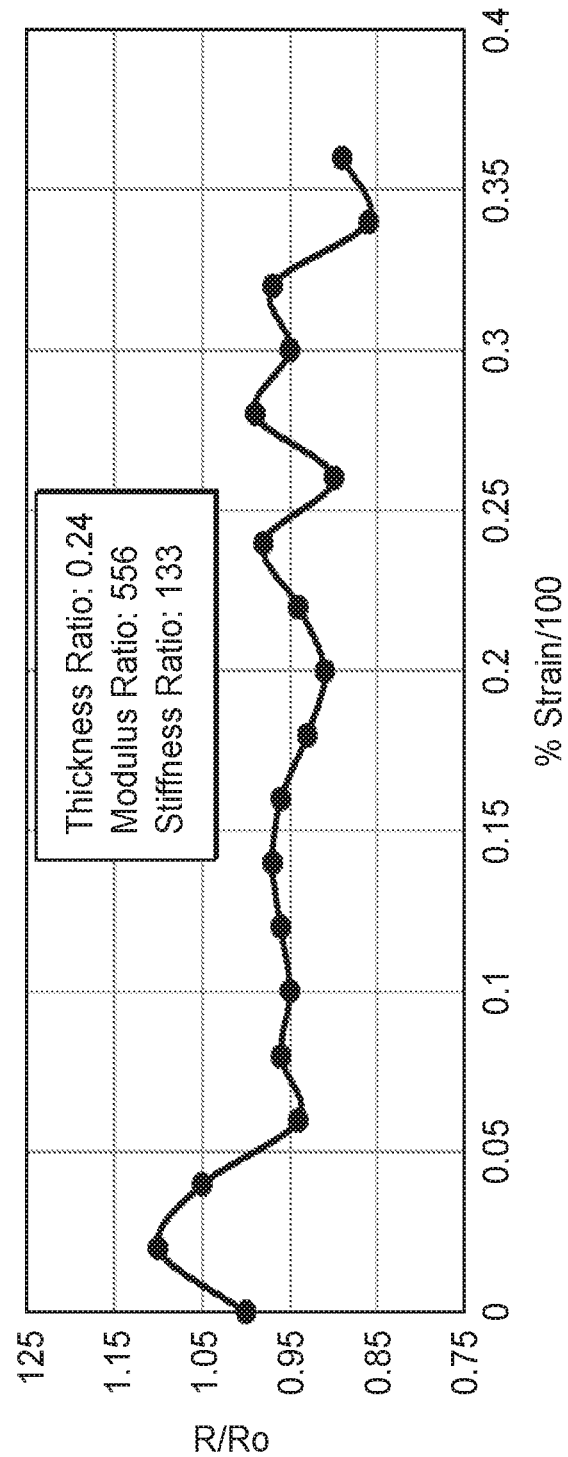
FIG. 10C is a plot of R/R0 versus strain for a high modulus island structure on a thick substrate.

FIG. 10A is a plot of R/R0 versus strain for a lower modulus island (NOA) on a thick substrate (VHB tape). FIG. 10B is a plot of R/R0 versus strain for a lower modulus island structure (NOA) on a thin substrate (VHB tape). FIG. 10C is a plot of R/R0 versus strain for a high modulus island (DP100 epoxy) on a thick substrate (VHB tape). The thickness ratio (t2/t1), modulus ration (E2/E1), and stiffness ration (E2*t2)/(E1*t1) are detailed in FIGS. 10A-C, where E1 and E2 are the respective elasticity moduli of the substrate 91 and the island 92, and t1 and t2 are the respective thicknesses of the substrate 91 and the island 92.

Comparing FIGS. 10A and 10B, the modulus ratio (E2/E1) is constant, and the thickness ratio (t2/t1) is increased. This increases the stiffness ratio from 2.4 to 10.2. The sample shown in FIG. 10A broke (an abrupt increase of R/R0) at about 5% strain while the sample shown in FIG. 10B survived up to 35% strain on the substrate. This confirms the trend shown by the simulations of FIG. 9B, as the device can survive at higher strains with a higher stiffness ratio. Comparing FIGS. 10A and 10C, the modulus ratio (E2/E1) is increased and the thickness ratio (t2/t1) is decreased. Since DP100 epoxy has a significantly higher modulus than that of NOA, the overall stiffness ratio is increased. The sample in FIG. 10C was able to survive at higher strains (even though the island of DP100 was thinner). Thus, this demonstrates that thin devices having an island structure described herein can minimize total thickness by manipulating the modulus ratio.

Samples-II: PE2-PE4

Unless otherwise noted, all parts, percentages, ratios, etc. in the examples and the rest of the specification are by weight. Table 2 below lists materials used for Samples-II.

TABLE 2

| Material designation | Description |
|---|---|
| BHT | 2,6-di-t-butyl-4-methylphenol obtained from Alfa Aesar, Haverhill, MA. |
| BiN | Bismuth neodecanoate obtained from Sigma-Aldrich, St. Louis, MO. |
| C-2050 | A polycarbonate diol of about 2000 MW made with about a 50% (i.e., 5:5) mole ratio of (MPD):(HD), obtained as "KURARAY POLYOL C-2050" from Kuraray Co. Ltd. |
| Desmodur I (IPDI) | Hexamethylene diisocyanate, under trade designation "DESMODUR I" equivalent weight 111.11, molecular weight 222.22 g/mole, from Covestro LLC. |
| HEMA | Hydroxyethyl methacrylate, obtained from TCI America, Portland, OR. |
| IBOMA | Isobornyl methacrylate obtained as "SR423A" from Sartomer. |
| TPO | 2,4,6-trimethylbenzoyldiphenylphosphine oxide photoinitiator obtained as "IRGACURE TPO" from BASF. |

A 3 L three-necked round-bottom flask was charged with 1176.57 g C-2050 (1.195 eq, 984.5 hydroxide equivalent weight (OH EW), heated to about 58° C.), then 265.57 g IPDI (2.390 eq), 0.640 g BHT (400 ppm), and 0.40 g BiN (250 ppm). The reaction was heated under dry air to an internal setpoint of 105° C. (maximum temperature reached was about 120° C.). At 1 hour and 35 minutes, 157.86 g HEMA (1.2130 eq, 130.14 MW, a 1.5% excess) was added via an addition funnel at a steady rate over 20 minutes. At about 2.75 hours into the total reaction time, an aliquot was checked by Fourier transform infrared spectroscopy (FTIR) and found to have no –NCO peak at 2265 cm$^{-1}$ and the product was isolated as a clear, viscous material.

Sample PE2-PE4 were prepared by mixing the following materials in Table 3, all given in grams.

TABLE 3

| Example | Weight Ratio of PE1:IBOMA | PE1 | IBOMA | TPO |
|---|---|---|---|---|
| PE2 | 50:50 | 55 | 55 | 2.2 |
| PE3 | 40:60 | 44 | 66 | 2.2 |
| PE4 | 30:70 | 33 | 77 | 2.2 |

Figure 11:
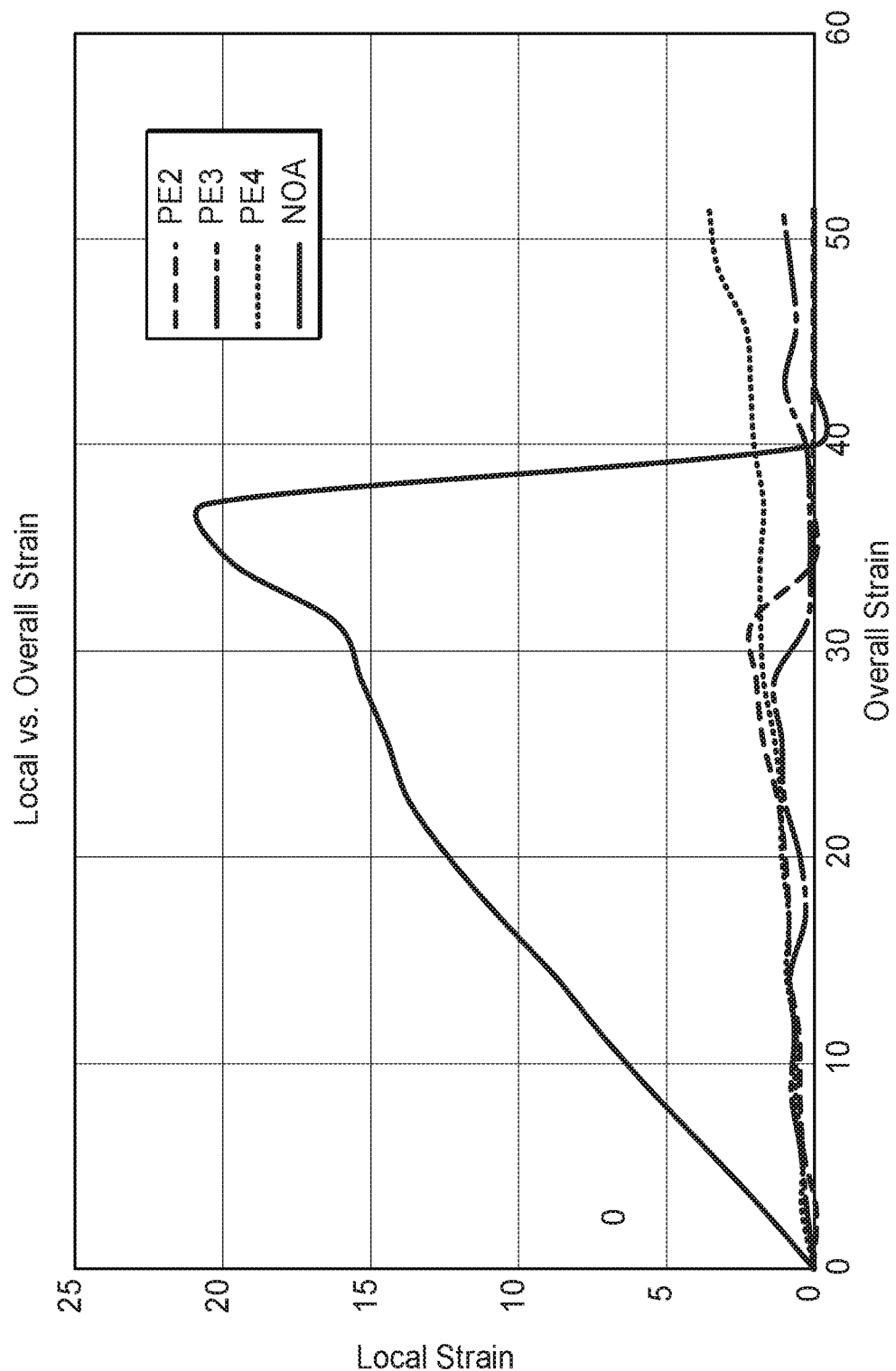
FIG. 11 is a plot of local strain versus overall strain for Examples.

Samples having a two-layer island structure as shown in FIG. 9A were prepared to demonstrate improved stretchability. Flat islands (about 3 to about 4 mils thick) of NOA and PE2, PE3 & PE4 (details below) were created on VHB substrates. Briefly, a drop of island material was dispensed on the VHB substrate and a PET liner was placed on the droplet to spread it out evenly on the substrate. The island material was then fully solidified by a two-stage UV curing process through the liner. The liner was then removed, and black powder was speckled on the islands to assist with local strain-mapping using digital image correlation (DIC). Results of the local strain experienced by the island observed by these materials in response to an overall applied strain are plotted as shown in FIG. 11. When fully cured, none of the PE2, PE3 & PE4 islands reach above 4% local strain for up to 30% overall strain. The local strain in these materials is less than 7% at up to 52% local strain. NOA islands, on the other hand, experience local strains more than 10% for 30% overall strain.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about." Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. A method of making a flexible device, the method comprising:
providing a flexible substrate including a registration area and one or more channels on a major surface thereof, the channels extending into the registration area;
providing a solid circuit die on the registration area, the solid circuit die having one or more contact pads on a surface thereof;
forming one or more electrically conductive traces in the channels to electrically contact with the contact pads of the solid circuit die, wherein the electrically conductive traces have a free surface;
flowing a first polymer liquid on the free surfaces of the electrically conductive traces in the channels to cover the free surfaces of the electrically conductive traces; and
solidifying the first polymer liquid to a form a product that covers the free surface of the electrically conductive traces and has a higher modulus than that of the flexible substrate.

2. The method of claim 1, wherein flowing the first curable polymer further comprises filling a cavity in the channels underneath the solid circuit die with the first polymer liquid, primarily by a capillary force.

3. The method of claim 1, wherein the registration area includes a pocket to receive the solid circuit die, and the pocket is oversized such that there is a gap between edges of the pocket and the solid circuit die.

4. The method of claim 3, further comprising flowing a second polymer liquid in the gap to at least partially fill the gap.

5. The method of claim 4, further comprising solidifying the second polymer liquid, wherein a product of solidifying the second polymer liquid has a higher modulus than that of the flexible substrate.

6. The method of claim 1, wherein forming the one or more electrically conductive traces comprises disposing a conductive liquid into the channels and flowing the conductive liquid, primarily by a capillary force, in the channels, and solidifying the conductive liquid.

7. The method of claim 1, wherein the channels comprise an inlet channel and an outlet channel that are fluidly connected, and the first polymer liquid flows into the inlet channel.

8. A flexible device comprising:
a flexible substrate including a registration area and one or more channels on a major surface thereof, the channels extending into the registration area, wherein each channel has side walls and a bottom wall;
a solid circuit die disposed on the registration area, the solid circuit die having one or more contact pads on a surface thereof,
one or more electrically conductive traces formed in the channels, the traces forming one or more electrical contacts with the contact pads of the solid circuit die, wherein the electrically conductive traces have a surface covering the bottom wall and a portion of the side walls adjacent the bottom wall of the channels and a free surface; and
a product of solidifying a first polymer liquid that covers the free surface of the electrically conductive traces, wherein the product has a higher modulus than that of the flexible substrate.

9. The device of claim 8, wherein the product of solidifying the first polymer liquid at least partially fills a cavity in the channels underneath the solid circuit die.

10. The device of claim 8, wherein the product comprises a product of curing a UV curable polymer.

11. The device of claim 8, wherein the registration area includes a pocket to receive the solid circuit die, and a product of solidifying a second polymer fluid at least partially fills the gap.

12. The device of claim 11, wherein the product comprises a curing product of a UV curable polymer, and the product has a higher modulus than that of the flexible substrate.

13. The device of claim 8, wherein the channels comprise an inlet channel and an outlet channel that are fluidly connected, and the product of solidifying the first polymer liquid extends from the inlet channel into the outlet channel.

14. A flexible device comprising:
- a flexible substrate having a circuitry thereon;
- an island structure on the flexible substrate to at least partially cover the circuitry thereon, the island structure including one or more surface channels on an exposed surface thereof, and one or more via channels fluidly connected to at least one of the surface channels, each surface channel and each side channel has side walls and a bottom wall;
- one or more electrically conductive traces formed in the surface channels and the via channels to electrically contact with the circuitry on the flexible substrate underneath the island structure, wherein the electrically conductive traces have a surface covering the bottom wall and a portion of the side walls adjacent the bottom wall of the channels and a free surface; and
- a product of solidifying a first polymer liquid that covers a free surface of the electrically conductive traces.

15. The device of claim 14, wherein the flexible substrate having a modulus E1, and a thickness t1, the island structure having a modulus E2 and a thickness t2, and the ratio of (E2×t2)/(E1×t1) is greater than 7.

16. The device of claim 14, wherein the flexible substrate having a modulus E1, and a thickness t1, the island structure having a modulus E2 and a thickness t2, and when an overall in-plane strain applied onto the flexible substrate is between about 5% and about 50%, a required lower limit of the ratio of (E2×t2)/(E1×t1) is between about 5 and about 15, respectively.

17. The device of claim 14, further comprising an overcoat to cover the island structure.

18. The device of claim 14, wherein the first polymer liquid includes a UV curable polymer.

19. The device of claim 14, wherein the island structure further includes a pocket to receive a solid circuit die, and a product of solidifying a second polymer fluid at least partially surrounding a periphery of the solid circuit die.

20. The device of claim 14, wherein the island structure has a composition comprising:
  i) a urethane (meth)acrylate polymer comprising a reaction product of an aliphatic polyester, polycarbonate, or polyether diol, a diisocyanate, and a hydroxy functional methacrylate, and
  ii) a monofunctional (meth)acrylate monomer, wherein a cured homopolymer of at least one monofunctional (meth)acrylate monomer has a Tg of at least 60° C.

* * * * *

UNITED STATES PATENT AND TRADEMARK OFFICE
CERTIFICATE OF CORRECTION

PATENT NO. : 11,503,720 B2
APPLICATION NO. : 17/270912
DATED : November 15, 2022
INVENTOR(S) : Saagar Amar Shah It is certified that error appears in the above-identified patent and that said Letters Patent is hereby corrected as shown below:

In the Claims

Column 33
Line 18, In Claim 14, before "each surface channel", insert --wherein--.
Line 29, In Claim 14, "a free surface" shall be replaced with "the free surface".

Signed and Sealed this
Twenty-fifth Day of April, 2023

Katherine Kelly Vidal
*Director of the United States Patent and Trademark Office*